(12) United States Patent
Chiang et al.

(10) Patent No.: US 11,437,468 B2
(45) Date of Patent: Sep. 6, 2022

(54) ISOLATION STRUCTURES OF SEMICONDUCTOR DEVICES

(71) Applicant: Taiwan Semiconductor Manufacturing Co., Ltd., Hsinchu (TW)

(72) Inventors: Hung-Li Chiang, Taipei (TW); Chao-Ching Cheng, Hsinchu (TW); Tzu-Chiang Chen, Hsinchu (TW); I-Sheng Chen, Taipei (TW)

(73) Assignee: Taiwan Semiconductor Manufacturing Co., Ltd.

( * ) Notice: Subject to any disclaimer, the term of this patent is extended or adjusted under 35 U.S.C. 154(b) by 0 days.

(21) Appl. No.: 17/120,852

(22) Filed: Dec. 14, 2020

(65) Prior Publication Data

US 2021/0134945 A1    May 6, 2021

Related U.S. Application Data

(62) Division of application No. 16/419,077, filed on May 22, 2019, now Pat. No. 10,868,114.
(Continued)

(51) Int. Cl.
*H01L 29/76*   (2006.01)
*H01L 29/94*   (2006.01)
(Continued)

(52) U.S. Cl.
CPC ........ *H01L 29/0649* (2013.01); *H01L 21/308* (2013.01); *H01L 21/823431* (2013.01);
(Continued)

(58) Field of Classification Search
CPC .............. H01L 29/0649; H01L 21/308; H01L 21/823431; H01L 21/823437; H01L 21/823481; H01L 27/0886; H01L 29/66545; H01L 29/66795; H01L 29/785; H01L 21/32135; H01L 27/088; H01L 21/82345; H01L 29/165; H01L 29/7848;
(Continued)

(56) References Cited

U.S. PATENT DOCUMENTS 9,093,530 B2   7/2015  Huang et al.
9,171,929 B2   10/2015 Lee et al.
(Continued)

*Primary Examiner* — Theresa T Doan
(74) *Attorney, Agent, or Firm* — Sterne, Kessler, Goldstein & Fox P.L.L.C.

(57) ABSTRACT

The structure of a semiconductor device with isolation structures between FET devices and a method of fabricating the semiconductor device are disclosed. A method of fabricating the semiconductor device includes forming a fin structure on a substrate and forming polysilicon gate structures with a first threshold voltage on first fin portions of the fin structure. The method further includes forming doped fin regions with dopants of a first type conductivity on second fin portions of the fin structure, doping at least one of the polysilicon gate structures with dopants of a second type conductivity to adjust the first threshold voltage to a greater second threshold voltage, and replacing at least two of the polysilicon gate structures adjacent to the at least one of the polysilicon gate structures with metal gate structures having a third threshold voltage less than the first and second threshold voltages.

20 Claims, 32 Drawing Sheets

Related U.S. Application Data

(60) Provisional application No. 62/752,534, filed on Oct. 30, 2018.

(51) Int. Cl.
*H01L 31/062* (2012.01)
*H01L 29/06* (2006.01)
*H01L 29/66* (2006.01)
*H01L 29/78* (2006.01)
*H01L 21/308* (2006.01)
*H01L 21/8234* (2006.01)
*H01L 27/088* (2006.01)

(52) U.S. Cl.
CPC ........... *H01L 21/823437* (2013.01); *H01L 21/823481* (2013.01); *H01L 27/0886* (2013.01); *H01L 29/66545* (2013.01); *H01L 29/66795* (2013.01); *H01L 29/785* (2013.01)

(58) Field of Classification Search
CPC ........... H01L 29/0847; H01L 29/42392; H01L 29/66439; H01L 29/775; H01L 29/78696; H01L 29/0673; B82Y 10/00
USPC ....................................................... 257/368
See application file for complete search history.

(56) References Cited

U.S. PATENT DOCUMENTS

| | | |
|---|---|---|
| 9,214,555 B2 | 12/2015 | Oxland et al. |
| 9,236,267 B2 | 1/2016 | De et al. |
| 9,472,628 B2 | 10/2016 | Cheng et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 2016/0163604 A1* | 6/2016 | Xie ..................... H01L 27/1211 438/430 |
| 2019/0221483 A1* | 7/2019 | Mulfinger ............... B82Y 10/00 |
| 2019/0363184 A1 | 11/2019 | Reznicek et al. |
| 2020/0135849 A1 | 4/2020 | Chiang et al. |

* cited by examiner

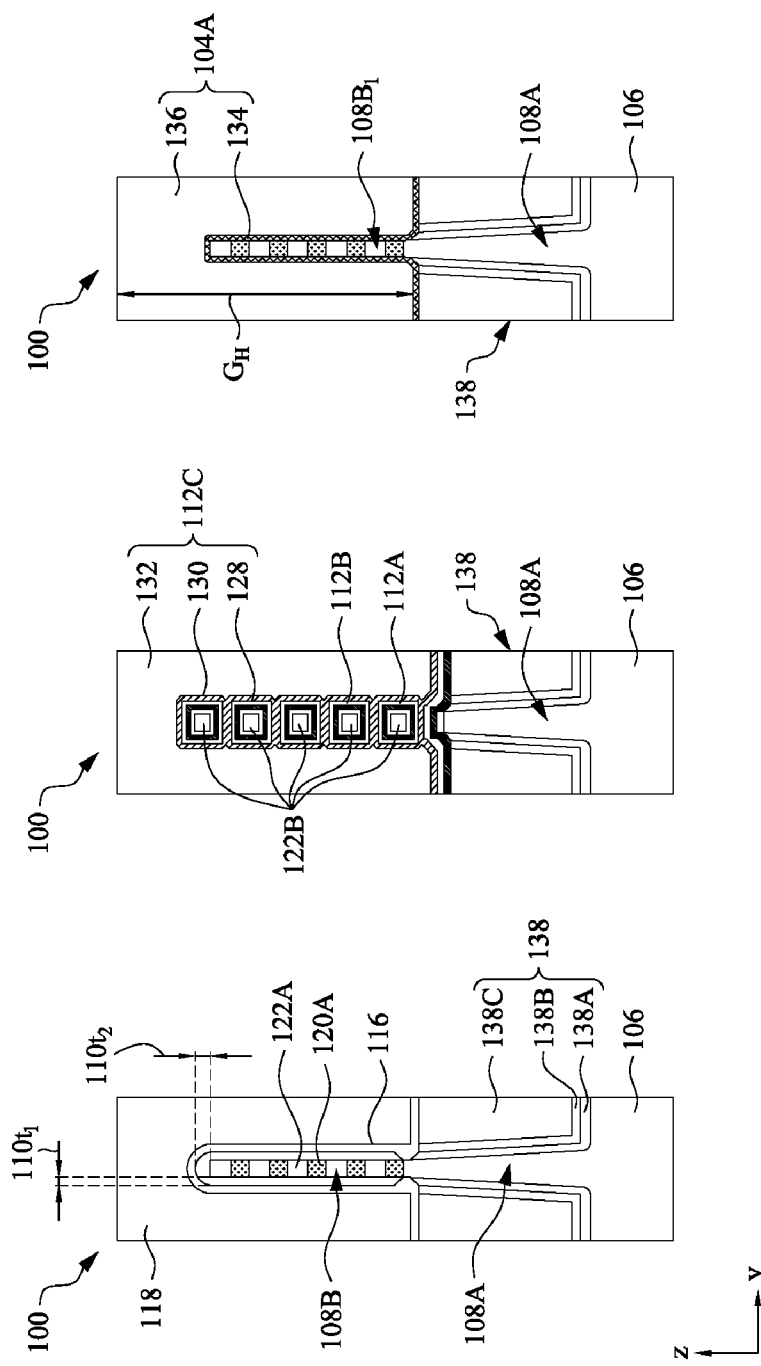

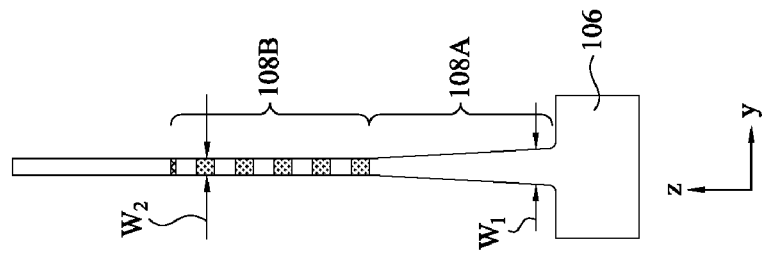
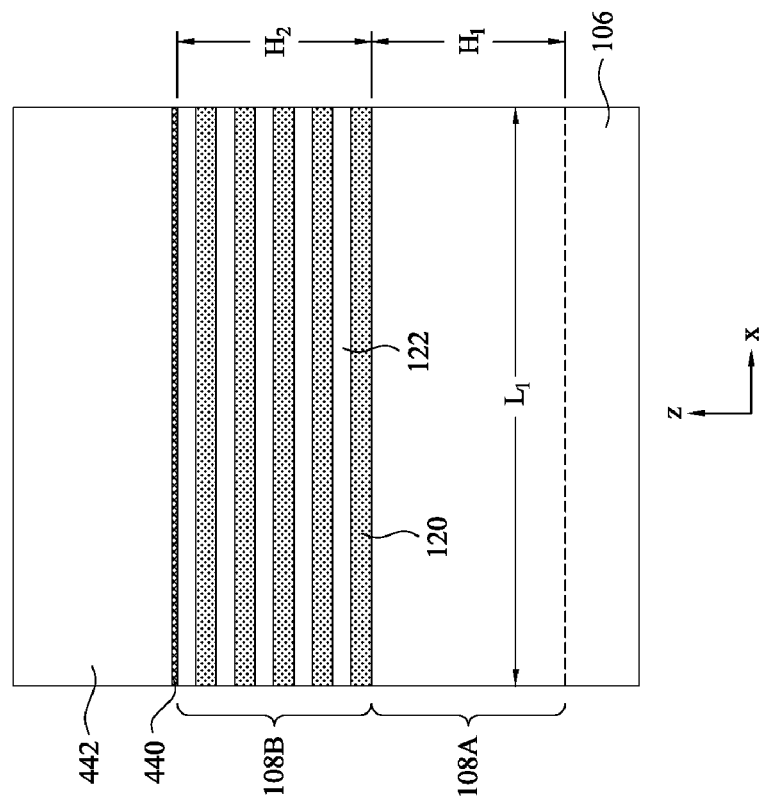

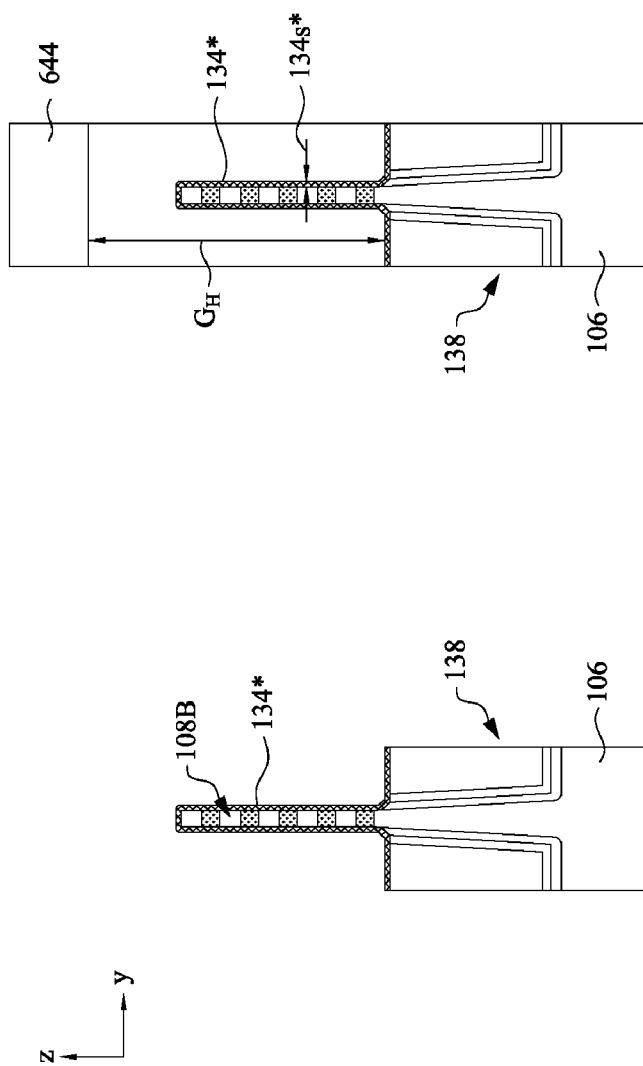

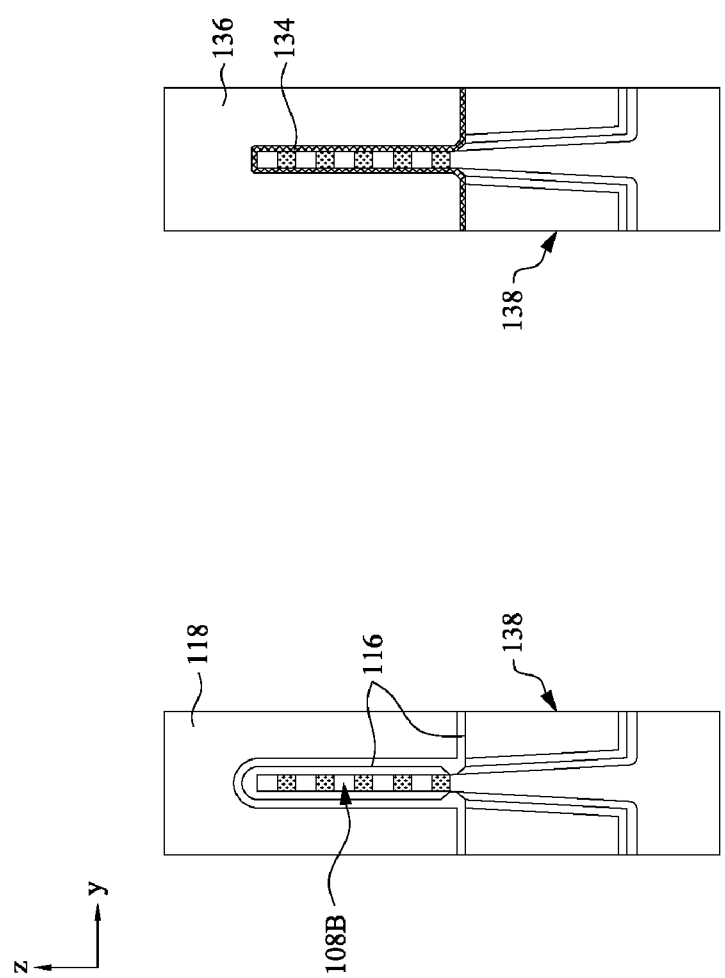

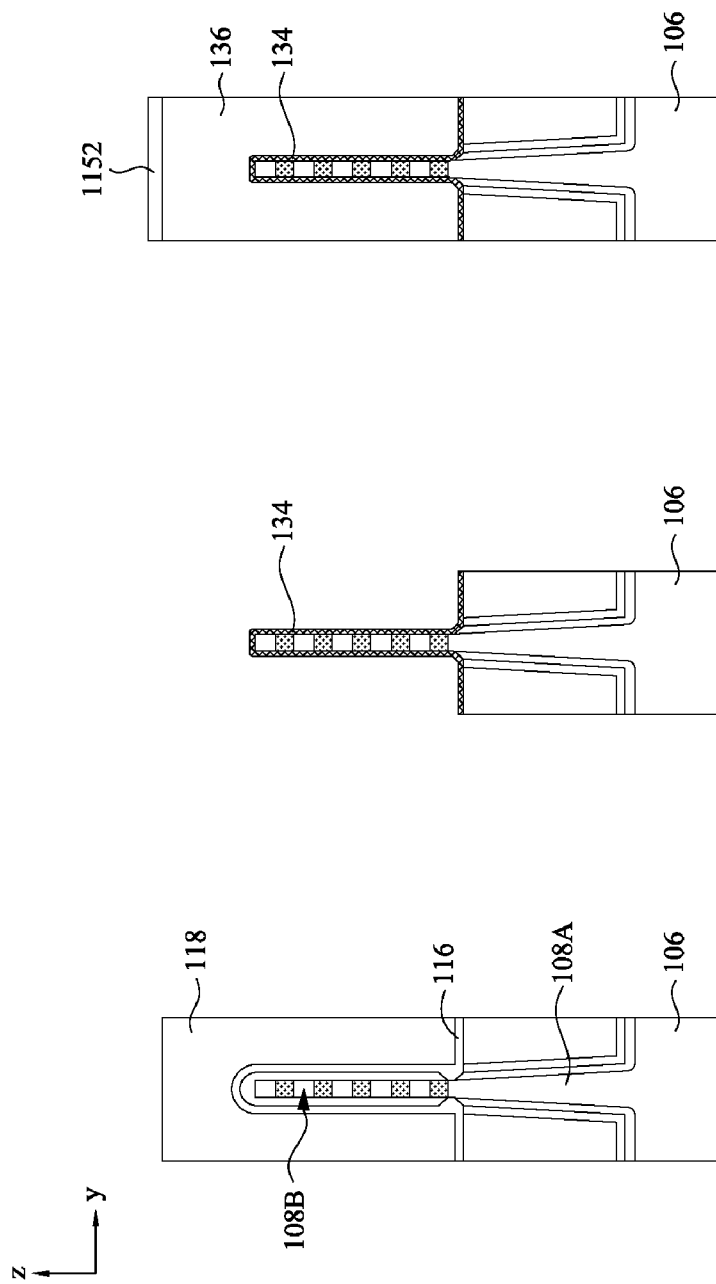

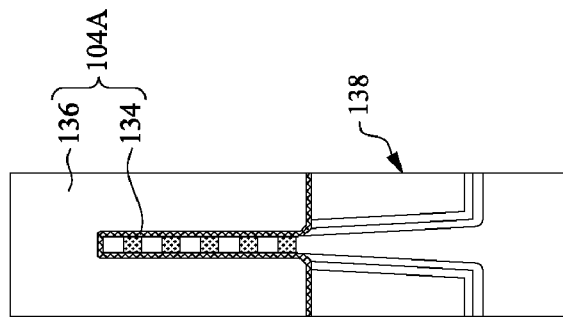
FIG. 12E
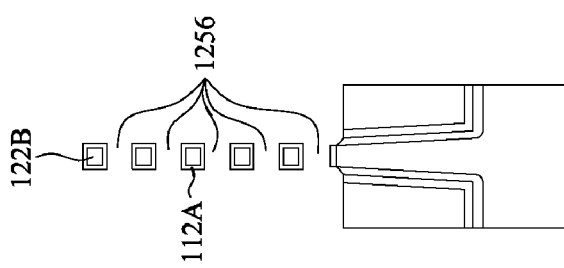
FIG. 12D
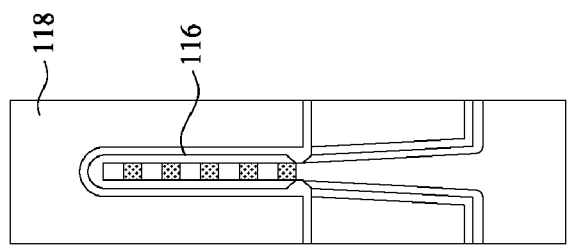
FIG. 12C
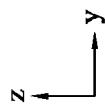

ISOLATION STRUCTURES OF SEMICONDUCTOR DEVICES

CROSS-REFERENCE TO RELATED APPLICATIONS

This application is a divisional of U.S. patent application Ser. No. 16/419,077, filed May 22, 2019, which claims priority of U.S. Provisional Patent Application No. 62/752,534, filed Oct. 30, 2018, each of which are incorporated by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 1A and 1B-1E illustrate an isometric view and cross-sectional views of a semiconductor device with an isolation structure, respectively, in accordance with some embodiments.

FIGS. 3A-12A illustrate isometric views of a semiconductor device with an isolation structure at various stages of its fabrication process, in accordance with some embodiments.

FIGS. 3B-12B, 3C-12C, 6D-12D, and 10E-12E illustrate cross-sectional views of a semiconductor device with an isolation structure at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
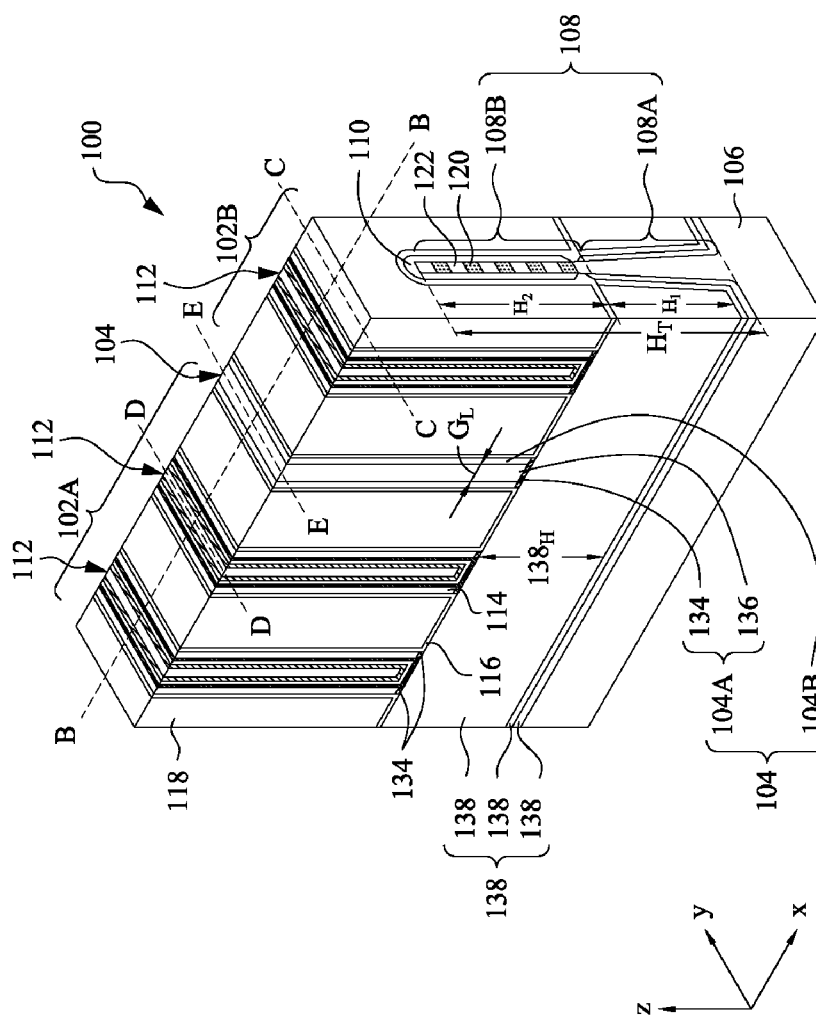

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "selectivity" refers to the ratio of the etch rates of two materials under the same etching conditions.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

As used herein, the term "about" indicates the value of a given quantity that can vary based on a particular technology node associated with the subject semiconductor device. In some embodiments, based on the particular technology node, the term "about" can indicate a value of a given quantity that varies within, for example, 5-30% of the value (e.g., ±5%, ±10%, ±20%, or ±30% of the value).

As used herein, the term "substantially" or "substantial" indicates the value of a given quantity that can vary based on a particular technology node associated with the subject semiconductor device. In some embodiments, based on the particular technology node, the term "substantially" can indicate a value of a given quantity that varies within, for example, ±5% of a target (or intended) value.

The fin structures discloses herein may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides example isolation structures between FET devices (e.g., finFETs or planar FETs) in a semiconductor device and/or in an integrated circuit (IC) and example methods for fabricating the same. The example methods can form isolation structures without substantially degrading (e.g., reducing or relaxing) strain in the channel regions of the FET devices, and consequently, without degrading channel mobility performance of the FET devices.

In some embodiments, the isolation structures can include polysilicon gate structures configured to electrically isolate the FET devices from each other. The polysilicon gate structures can be in a reverse bias configuration to provide electrical isolation between the FET devices. The polysilicon gate structures can be configured to have work function values resulting in higher threshold voltages and smaller reverse-bias leakage currents of the polysilicon gate structures than isolation structures based on non-polysilicon gate (e.g., metal gate) structures. The higher threshold voltages and smaller reverse-bias leakage currents provide more efficient and reliable electrical isolation between the FET devices than that achieved with the non-polysilicon gate structures.

In some embodiments, the threshold voltages of the polysilicon gate structures can be about 0.1 V to about 0.5 V greater (e.g., about 0.2 V, about 0.25 V about 0.3 V, about 0.35 V, about 0.4 V, or about 0.45 V greater) than the threshold voltages of the non-polysilicon gate structures. In some embodiments, the reverse-bias leakage currents of the polysilicon gate structures can be at least about 5 orders of magnitude smaller than the reverse-bias leakage currents of the non-polysilicon gate structures. In some embodiments, the reverse-bias leakage currents of the polysilicon gate structures can be about 5 orders to about 10 orders (e.g., about 6 orders, about 7 orders, about 8 orders, or about 9 orders) of magnitude smaller than the reverse-bias leakage currents of the non-polysilicon gate structures.

Such high threshold voltages and small reverse-bias leakage currents can be achieved in the polysilicon gate structures with high aspect ratios, (e.g., ratios between gate heights and gate lengths equal to or greater than about 9) and small gate lengths (e.g., gate lengths equal to or smaller than about 15 nm) fabricated without the complexities of depositing work function metals in a poly gate replacement process. As such, the polysilicon gate structures can be fabricated with fewer process steps and at lower manufacturing costs than the non-polysilicon gate structures with similar high aspect ratios and small gate lengths. As a result, the example isolation structures disclosed herein can increase the packing density of FET devices in the semiconductor device and/or in the integrated circuit (IC) without a substantial trade-off between manufacturing costs and device performance.

Figure 1B:
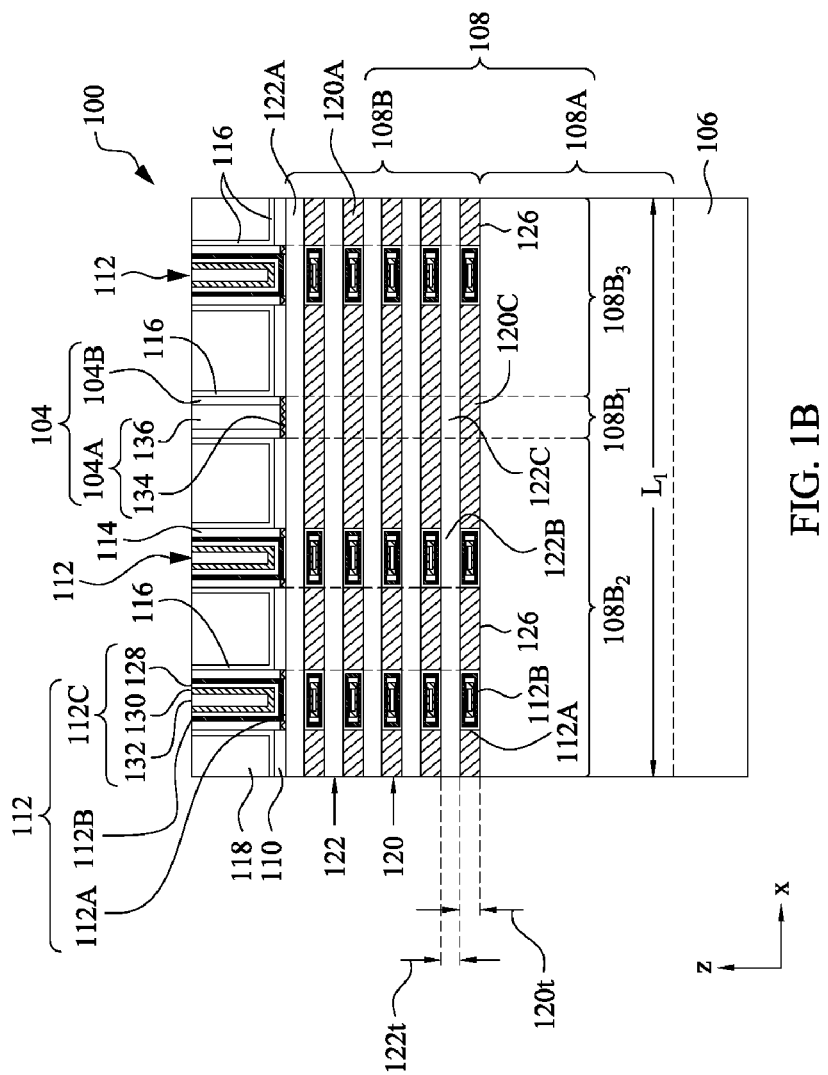

A semiconductor device 100 having finFETs 102A-102B and an isolation structure 104 configured to electrically isolate finFETs 102A-102B from each other is described with reference to FIGS. 1A-1E, according to some embodiments. FIG. 1A illustrates an isometric view of semiconductor device 100, according to some embodiments. FIG. 1B-1E illustrate cross-sectional views along lines B-B, C-C, D-D, and E-E of semiconductor device 100 of FIG. 1A, respectively, according to some embodiments. In some embodiments, finFETs 102A-102B can be both p-type finFETs (PFETs) or n-type finFETs (NFETs) or one of each conductivity type finFETs. Even though two finFETs and one isolation structure is shown in FIGS. 1A-1B, semiconductor device 100 can have any number of finFETs and isolation structures. The discussion of elements of finFET 102A-102B and isolation structure 104 with the same annotations applies to each other, unless mentioned otherwise. The isometric view of semiconductor device 100 is shown for illustration purposes and may not be drawn to scale.

Referring to FIGS. 1A-1B, finFETs 102A-102B and isolation structure 104 can be formed on a substrate 106. Substrate 106 can be a semiconductor material such as, but not limited to, silicon. In some embodiments, substrate 106 includes a crystalline silicon substrate (e.g., wafer). In some embodiments, substrate 106 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 106 can be doped depending on design requirements (e.g., p-type substrate or n-type substrate). In some embodiments, substrate 106 can be doped with p-type dopants (e.g., boron, indium, aluminum, or gallium) or n-type dopants (e.g., phosphorus or arsenic).

Semiconductor device 100 can further include a fin structure 108 extending along an X-axis and through finFETs 102A-102B and isolation structure 104. In some embodiments, isolation structure 104 can be disposed on a first portion 108B$_1$ of fin structure 108 and finFETs 102A-102B can include second and third portions 108B$_2$ and 108B$_3$ of fin structure 108 configured to form active regions of finFETs 102A-102B, respectively.

Figure 8A:
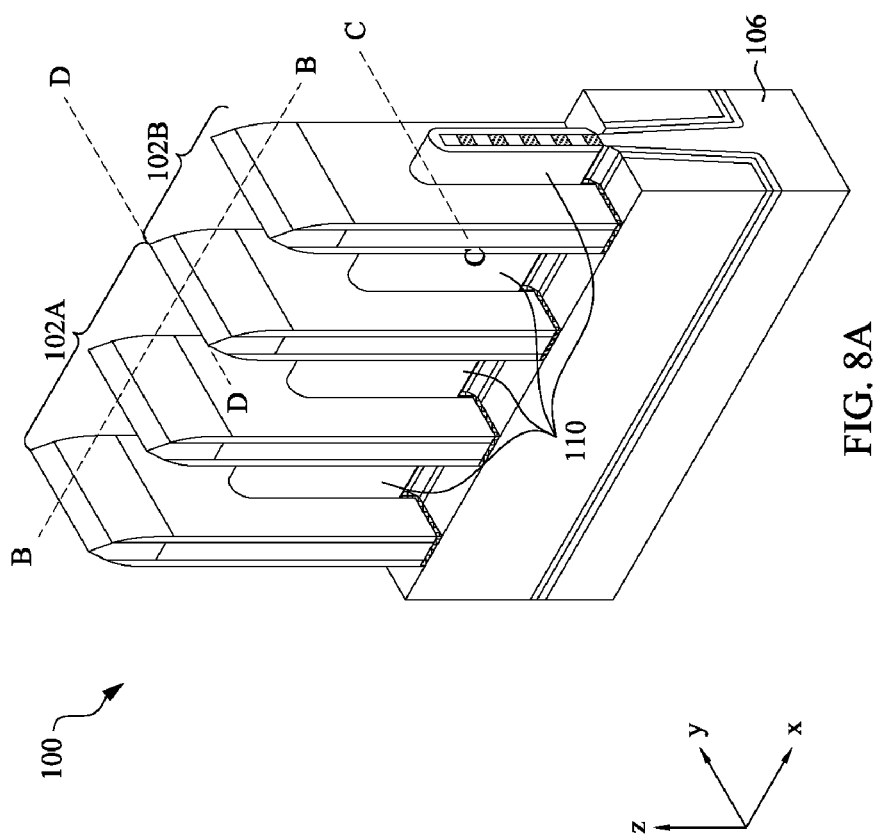
Figure 8B:
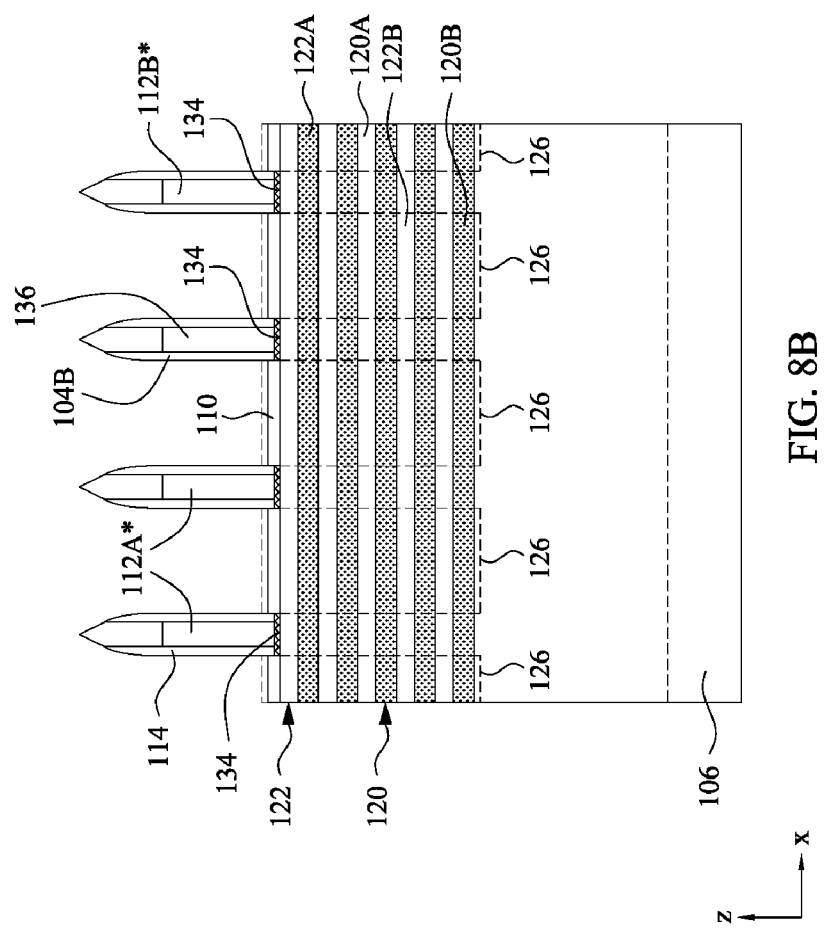

Fin structure 108 can include a fin base portion 108A and a stacked fin portion 108B disposed on fin base portion 108A. In some embodiments, fin base portion 108A can include material similar to substrate 106. Fin base portion 108A can be formed from a photolithographic patterning and an etching of substrate 106. Stacked fin portion 108B can include first and second semiconductor layers 120 and 122 stacked in an alternating configuration. Each first semiconductor layer 120 can have first fin regions 120A (shown in FIG. 1B) underlying epitaxial fin regions 110, second fin regions 120B (not shown in FIGS. 1A-1E; shown in FIG. 8B) prior to being etched to form gate structures 112, as described in further detail below, and a third fin region 120C underlying isolation structure 104. Each second semiconductor layer 122 can have first fin regions 122A underlying epitaxial fin regions 110, second fin regions 122B underlying gate structures 112, and a third fin region 122C underlying isolation structure 104.

First and second semiconductor layers 120 and 122 can be epitaxially grown and can include semiconductor materials different from each other. In some embodiments, first and second semiconductor layers 120 and 122 can include semiconductor materials similar to or different from substrate 106. In some embodiments, first and second semiconductor layers 120 and 122 can include semiconductor materials with oxidation rates and/or etch selectivity different from each other. In some embodiments, each of first and second semiconductor layers 120 and 122 can include silicon germanium (SiGe) with Ge in a range from about 25 atomic percent to about 50 atomic percent (e.g., about 30 atomic percent, 35 atomic percent, or about 45 atomic percent) with any remaining atomic percent being Si or can include Si without any substantial amount of Ge.

The semiconductor materials of first and/or second semiconductor layers 120 and 122 can be undoped or can be in-situ doped during their epitaxial growth process using: (i) p-type dopants, such as boron, indium, or gallium; and/or (ii) n-type dopants, such as phosphorus or arsenic. For p-type in-situ doping, p-type doping precursors, such as diborane ($B_2H_6$), boron trifluoride ($BF_3$), and/or other p-type doping precursors can be used. For n-type in-situ doping, n-type doping precursors, such as phosphine ($PH_3$), arsine ($AsH_3$), and/or other n-type doping precursor can be used. First and second semiconductor layers 120 and 122 can have respective vertical dimensions $120t$ and $122t$ (e.g., thicknesses) along a Z-axis, each ranging from about 6 nm to about 10 nm (e.g., about 7 nm, about 8 nm, or about 9.5 nm). Vertical dimensions $120t$ and $122t$ can be equal to or different from each other.

In some embodiments, fin base portion 108A and stacked fin portion 108B can have respective vertical dimensions $H_1$ and $H_2$ (e.g., heights) along a Z-axis, each ranging from about 40 nm to about 60 nm (e.g., about 45 nm, about 50 nm, or about 55 nm). Vertical dimensions $H_1$ and $H_2$ can be equal to or different from each other and can have values such that the sum of $H_1$ and $H_2$ (i.e., total height $H_T$ of fin structure 108) ranges from about 80 nm to about 120 nm (e.g., about 85 nm, about 90 nm, about 100 nm, or about 115 nm). In some embodiments, fin structure 108 can have a horizontal dimension $L_1$ (e.g., length) along an X-axis ranging from about 100 nm to about 1 μm (e.g., about 200 nm, about 300 nm, about 500 nm, about 750 nm, or about 900 nm). Horizontal dimension $L_1$ of fin structure 108 can be at least 100 nm to prevent the relaxation of strain in fin structure 108, and consequently, prevent the relaxation of strain in channel regions formed in second fin regions 122B under gate structures 112. Other dimensions and materials for fin structure 108 are within the scope and spirit of this disclosure.

In some embodiments, finFETs 102A-102B can further include epitaxial fin regions 110, gate structures 112, and spacers 114.

Referring to FIGS. 1A-1B, epitaxial fin regions 110 can be grown on regions of stacked fin portion 108B that do not underlie gate structures 112. Epitaxial fin regions 110 can include an epitaxially-grown semiconductor material. In some embodiments, the epitaxially grown semiconductor material is the same material as the material of substrate 106. In some embodiments, the epitaxially-grown semiconductor material includes a different material from the material of substrate 106. The epitaxially-grown semiconductor material can include: (i) a semiconductor material, such as germanium or silicon; (ii) a compound semiconductor material, such as gallium arsenide and/or aluminum gallium arsenide; or (iii) a semiconductor alloy, such as silicon germanium and/or gallium arsenide phosphide.

Referring to FIG. 1C, in some embodiments, epitaxial fin regions 110 can each have a thickness $110t_1$ along sidewalls of stacked fin portion 108B and a thickness $110t_2$ on top surface of stacked fin portion 108B. In some embodiments, thicknesses $110t_1$ and $110t_2$ can be equal to or different from each other. In some embodiments, each of thicknesses $110t_1$ and $110t_2$ can range from about 3 nm to about 6 nm (e.g., about 3.5 nm, about 4 nm, about 4.5 nm, or about 5 nm).

In some embodiments, epitaxial fin regions 110 can be grown by (i) chemical vapor deposition (CVD), such as low pressure CVD (LPCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, epitaxial fin regions 110 can be grown by an epitaxial deposition/partial etch process, which repeats the epitaxial deposition/partial etch process at least once. Such repeated deposition/partial etch process is also called a cyclic deposition-etch (CDE) process.

Epitaxial fin regions 110 can be p-type or n-type for PFETs 102A-102B or NFETs 102A-102B, respectively. In some embodiments, epitaxial fin regions 110 of finFET 102A and finFET 102B can be the same or opposite doping type with respect to each other. P-type epitaxial fin regions 110 can include SiGe and can be in-situ doped during an epitaxial growth process using p-type dopants, such as boron, indium, or gallium. For p-type in-situ doping, p-type doping precursors such as, but not limited to, diborane ($B_2H_6$), boron trifluoride ($BF_3$), and/or other p-type doping precursors can be used.

In some embodiments, each p-type epitaxial fin region 110 can have a plurality of sub-regions (not shown) that may include SiGe and may differ from each other based on, for example, doping concentration, epitaxial growth process conditions, and/or relative concentration of Ge with respect to Si. Each of the sub-regions can have thicknesses similar to or different from each other and thicknesses may range from about 0.5 nm to about 5 nm (e.g., about 1 nm, about 2 nm, about, or about 4 nm). In some embodiments, the atomic percent Ge in the sub-region closest to stacked fin portion 108B can be smaller than the atomic percent Ge in the sub-region farthest from stacked fin portion 108B. In some embodiments, the sub-region closest to stacked fin portion 108B can include Ge in a range from about 15 atomic percent to about 35 atomic percent (e.g., about 20 atomic percent, about 25 atomic percent, or about 30 atomic percent), while the sub-region farthest from stacked fin portion 108B can include Ge in a range from about 25 atomic percent to about 50 atomic percent (e.g., about 30 atomic percent, 35 atomic percent, or about 45 atomic percent) with any remaining atomic percent being Si in the sub-regions.

These plurality of sub-regions of p-type epitaxial fin regions 110 can be epitaxially grown under a pressure of about 10 Torr to about 300 Torr and at a temperature of about 500° C. to about 700° C. using reaction gases such as HCl as an etching agent, GeH4 as Ge precursor, dichlorosilane (DCS) and/or SiH4 as Si precursor, B2H6 as B dopant precursor, H2, and/or N2. To achieve different concentration of Ge in the plurality of sub-regions, the ratio of a flow rate of Ge to Si precursors is varied during their respective growth process, according to some embodiments. For example, a Ge to Si precursor flow rate ratio in a range from about 9 to about 25 (e.g., about 10, about 15, or about 20) can be used during the epitaxial growth of the sub-region closest to stacked fin portion 108B, while a Ge to Si precursor flow rate ratio less than about 6 (e.g., about 5.5, about 5, about 4.5, about 4, about 2.5, or about 2) can be used during the epitaxial growth of the sub-region farthest from stacked fin portion 108B.

The plurality of sub-regions of p-type epitaxial fin regions 110 can have varying p-type dopant concentration with respect to each other, according to some embodiments. For example, the sub-region closest to stacked fin portion 108B can be undoped or may have a dopant concentration lower (e.g., dopant concentration less than about $8 \times 10^{20}$ atoms/$cm^3$) than the dopant concentration (e.g., dopant concentration in a range from about $1 \times 10^{20}$ to about $3 \times 10^{22}$ atoms/$cm^3$) of the sub-region farthest from stacked fin portion 108B.

In some embodiments, n-type epitaxial fin regions 110 can include Si and may be in-situ doped during an epitaxial growth process using n-type dopants, such as phosphorus or arsenic. For n-type in-situ doping, n-type doping precursors such as, but not limited to, phosphine ($PH_3$), arsine ($AsH_3$), and/or other n-type doping precursor can be used. Each n-type epitaxial fin region 110 can have a plurality of n-type sub-regions. Except for the type of dopants, the plurality of n-type sub-regions may be similar to the plurality of p-type sub-regions, in thickness, relative Ge concentration with respect to Si, dopant concentration, and/or epitaxial growth process conditions. Other materials, thicknesses, Ge concentrations, and dopant concentrations for the plurality of n-type and/or p-type sub-regions are within the scope and spirit of this disclosure.

Referring to FIG. 1B, epitaxial fin regions 110 along with their underlying first fin regions 120A and 122A of respective semiconductor layers 120 and 122 can form source/drain (S/D) regions 126 of finFETs 102A-102B. Each of the channel regions in second fin regions 122B of finFETs 102A-102B can be interposed between a pair of S/D regions 126. Even though finFETs 102A-102B are shown to have fin structure 108 with stacked fin portion 108B of alternating layers of material on fin base portion 108A, other fin structures (e.g., a single layered fin structure etched from or epitaxially grown on substrate 106) of finFETs 102A and/or 102B are within the scope and spirit of this disclosure.

Referring to FIGS. 1A-1B and 1D, gate structures 112 can be multi-layered structures and can be disposed on regions of top surface and sidewalls of stacked fin portion 108B not covered by epitaxial fin regions 110 and isolation structure 104. In some embodiments, each second fin region 122B can be wrapped around by one of gate structures 112 or one or more layers of one of gate structures 112 for which gate structures 112 can be also referred to as "gate-all-around (GAA) structures" or "horizontal gate-all-around structures" and finFETs 102A-102B can be also referred to as "GAA FETs."

Each gate structure 112 can include an oxide layer 112A, a gate dielectric layer 112B disposed on oxide layer 112A, and a gate electrode 112C disposed on dielectric layer 112B. As shown in FIG. 1D, oxide layers 112A and gate dielectric layers 112 can be wrapped around second fin regions 122B to fill the spaces between adjacent second fin regions 112B, and thus, electrically isolate second fin regions 122B from each other and from conductive gate electrode 112C to prevent shorting between gate structures 112 and S/D regions 126 during operation of finFETs 102A-102B. In some embodiments, each oxide layer 112A can include a semiconductor oxide material (e.g., silicon oxide or silicon germanium oxide) and can have a thickness ranging from about 1 nm to about 10 nm (e.g., about 1 nm, about 2 nm, about 5 nm, or about 10 nm).

Each gate dielectric layer 112B can have a thickness ranging from about 1 nm to about 5 nm. Each gate dielectric layer 112B can include silicon oxide and can be formed by CVD, atomic layer deposition (ALD), physical vapor deposition (PVD), e-beam evaporation, or other suitable processes. In some embodiments, each gate dielectric layer 112B can include (i) a layer of silicon oxide, silicon nitride, and/or silicon oxynitride, (ii) a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium silicate ($ZrSiO_2$), (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. High-k dielectric layers can be formed by ALD and/or other suitable methods. In some embodiments, each gate dielectric layer 112B can include a single layer or a stack of insulating material layers. Other materials and formation methods for gate dielectric layers 112B are within the scope and spirit of this disclosure.

In some embodiments, each gate electrode 112C can include a gate barrier layer 128, a gate work function layer 130, and a gate metal fill layer 132. As shown in FIG. 1D, each second fin region 122B can be wrapped around by one of gate barrier layers 128 and one of gate work function layers 130. Depending on the spaces between adjacent second fin regions 122B and the thicknesses of the layers of gate structures 112, each second fin region 122B can be wrapped around by one or more layers of gate electrodes 112C filling the spaces between adjacent second fin regions 122B. Even though FIG. 1D shows gate metal fill layers 132 partially wrapped around second fin regions 122B, gate metal fill layers 132 can also wrap around second fin regions 122B to fill the spaces between adjacent second fin regions 122B (not shown), according to some embodiments.

In some embodiments, gate barrier layers 128 can serve as nucleation layers for subsequent formation of gate work function layers 130 and/or can help to prevent substantial diffusion of metals (e.g., Al) from gate work function layers 130 to underlying layers (e.g., gate dielectric layers 112B or oxide layers 112A). Each gate barrier layer 128 can include titanium (Ti), tantalum (Ta), titanium nitride (TiN), tantalum nitride (TaN), or other suitable diffusion barrier materials and can be formed by ALD, PVD, CVD, or other suitable metal deposition processes. In some embodiments, gate barrier layers 128 can include substantially fluorine-free metal or metal-containing film and can be formed by ALD or CVD using one or more non-fluorine based precursors. The substantially fluorine-free metal or fluorine-free metal-containing film can include an amount of fluorine contaminants less than 5 atomic percent in the form of ions, atoms, and/or molecules. In some embodiments, each gate barrier layer 128 can have a thickness ranging from about 1 nm to about 10 nm. Other materials, formation methods and thicknesses for gate barrier layers 128 are within the scope and spirit of this disclosure.

Each gate work function layer 130 can include a single metal layer or a stack of metal layers. The stack of metal layers can include metals having work function values equal to or different from each other. In some embodiments, each gate work function layer 130 can include aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. In some embodiments, each gate work function layer 130 can include Al-doped metal, such as Al-doped Ti, Al-doped TiN, Al-doped Ta, or Al-doped TaN. Gate work function layers 130 can be formed using a suitable process such as ALD, CVD, PVD, plating, or combinations thereof. In some embodiments, each gate work function layer 130 can have a thickness ranging from about 2 nm to about 15 nm. Other materials, formation methods and thicknesses for gate work function layers 130 are within the scope and spirit of this disclosure.

Each gate metal fill layer 132 can include a single metal layer or a stack of metal layers. The stack of metal layers can include metals different from each other. In some embodiments, each gate metal fill layer 132 can include a suitable conductive material, such as Ti, silver (Ag), Al, titanium aluminum nitride (TiAlN), tantalum carbide (TaC), tantalum carbo-nitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, and/or combinations thereof. Gate metal fill layers 132 can be formed by ALD, PVD, CVD, or other suitable deposition processes. Other materials and formation methods for gate metal fill layers 132 are within the scope and spirit of this disclosure. Even though gate structures 112 of finFETs 102A-102B are shown to be similar, finFETs 102A-102B can have gate structures with materials and/or electrical properties (e.g., threshold voltage, work function value) different from each other. Also, even though gate structures 112 are shown to have horizontal GAA structures, other gate structures (e.g., vertical GAA structures or gate structures without GAA structures) are within the scope and spirit of this disclosure Referring to FIGS. 1A-1B, spacers 114 can form sidewalls of gate structures 112 and be in physical contact with oxide layers 112A and gate dielectric layers 112B, according to some embodiments. Spacers 114 can include insulating material, such as silicon oxide, silicon nitride, a low-k material, or a combination thereof. Spacers 114 can have a low-k material with a dielectric constant less than about 3.9 (e.g., about 3.5, about 3.0, or about 2.8). In some embodiments, each spacer 114 can have a thickness ranging from about 7 nm to about 10 nm. Other materials and thicknesses for spacers 114 are within the scope and spirit of this disclosure.

Referring to FIGS. 1A-1B and 1E, isolation structure 104 can be configured to electrically isolate finFETs 102A-102B from each other formed with same fin structure 108. With isolation structure 104, electrical isolation between finFETs 102A-102B with the same fin structure 108 can be achieved without cutting (e.g., etching or removing) portions of fin structure 108 along the channel regions extending along an X-axis in second fin regions 122B of finFETs 102A-102B and replacing with insulating material as done in other methods of forming isolation structures, such as shallow trench isolation (STI) structures. This fin cutting process performed in other methods reduce strain in fin structures and adversely affect channel mobility performance of finFETs. Thus, isolation structure 104 can be formed without substantially degrading (e.g., reducing or relaxing) strain in the channel regions of finFETs 102A-102B, and consequently, without degrading channel mobility performance of finFETs 102A-102B.

In some embodiments, isolation structure 104 can include a polysilicon gate structure 104A and spacers 104B forming sidewalls of polysilicon gate structure 104A. The discussion of spacers 114 applies to spacers 104B unless mentioned otherwise. Polysilicon gate structure 104A can be disposed on first portion $108B_1$ of stacked fin portion 108B as shown in FIG. 1B and can cover top surface and sidewalls of first portion $108B_1$ as shown in FIG. 1E. In some embodiments, polysilicon gate structure 104A can include a gate oxide layer 134 disposed on top surface and sidewalls of first portion $108B_1$ and a polysilicon structure 136 can be disposed on gate oxide layer 134. Gate oxide layer 134 can have a thickness ranging from about 1 nm to about 3 nm (e.g., about 1.5 nm, about 1.8 nm, about 2 nm, about 2.5 nm, or about 2.8 nm). Polysilicon gate structure 104A can have a horizontal dimension $G_L$ (e.g., gate length; shown in FIG. 1A) along an X-axis ranging from about 3 nm to about 30 nm (e.g., about 5 nm, about 10 nm, about 15 nm, about 20 nm, or about 25 nm). In some embodiments, polysilicon gate structure 104A can have horizontal dimension $G_L$ equal to or smaller than 15 nm (e.g., about 1 nm, about 3 nm, about 5 nm, about 7 nm, about 10 nm, or about 15 nm). Polysilicon gate structure can have a high aspect ratio equal to or greater than about 9 (e.g., about 10, about 12, about 15, about 18, or about 20), where aspect ratio is a ratio of a vertical dimension $G_H$ (e.g., gate height; shown in FIG. 1E) of polysilicon gate structure 104A along a Z-axis to horizontal dimension $G_L$.

In some embodiments, polysilicon structure 136 can include undoped or doped polysilicon material. In some embodiments, polysilicon structure 136 can include dopants of conductivity type opposite to dopants of epitaxial fin regions 110 of finFETs 102A and/or 102B. In some embodiments, polysilicon structure 136 can have p-type dopants for electrically isolating NFETs 102A-102B or can have n-type dopants for electrically isolating PFETs 102A-102B. In some embodiments, polysilicon structure 136 can have p- or n-type dopants for electrically isolating finFETs 102A-102B having opposite conductivity type with respect to each other. In some embodiments, polysilicon structure 136 can have a dopant concentration ranging from about $3\times10^{18}$ atoms/cm$^3$ to about $5\times10^{23}$ atoms/cm$^3$ (e.g. about $5\times10^{18}$ atoms/cm$^3$ to about $5\times10^{23}$ atoms/cm$^3$, about $1\times10^{19}$ atoms/cm$^3$ to about $1\times10^{22}$ atoms/cm$^3$, about $1\times10^{20}$ atoms/cm$^3$ to about $5\times10^{22}$ atoms/cm$^3$, about $5\times10^{18}$ atoms/cm$^3$, about $1\times10^{19}$ atoms/cm$^3$, about $5\times10^{19}$ atoms/cm$^3$, about $3\times10^{20}$ atoms/cm$^3$, about $7\times10^{20}$ atoms/cm$^3$, about $1\times10^{21}$ atoms/cm$^3$, about $5\times10^{21}$ atoms/cm$^3$, about $3\times10^{22}$ atoms/cm$^3$, about $8\times10^{22}$ atoms/cm$^3$, or about $1\times10^{23}$ atoms/cm$^3$).

In some embodiments, the threshold voltage of polysilicon gate structure 104A with doped polysilicon structure 136 can be greater than the threshold voltage of polysilicon gate structure 104A with undoped polysilicon structure 136. In some embodiments, the reverse-bias leakage current of polysilicon gate structure 104A with doped polysilicon structure 136 can be smaller than the reverse-bias leakage current of polysilicon gate structure 104A with undoped polysilicon structure 136. The threshold voltage and the reverse-bias leakage current of polysilicon gate structure 104A can be adjusted by doping polysilicon structure 136 with dopants of conductivity type opposite to dopants of epitaxial fin regions 110 of finFETs 102A and/or 102B.

To provide electrical isolation between finFETs 102A-102B during operation, polysilicon gate structure 104A can be in a reverse bias configuration with respect to adjacent S/D regions 126 or can be in an inactive configuration. The reverse bias or inactive configuration of polysilicon gate structure 104A can prevent electrical conduction between S/D regions 126 of finFETs 102A-102B. Polysilicon gate structure 104A can be also referred to as "dummy gate" or "inactive gate." The work function value of polysilicon structure 136 can be higher than work function values of isolation structures based on non-polysilicon gate (e.g., metal gate) structures, resulting in higher threshold voltages and smaller reverse-bias leakage currents of polysilicon gate structure 104A than the non-polysilicon gate structures.

In some embodiments, the threshold voltage of polysilicon gate structure 104A can be about 0.1 V to about 0.5 V greater (e.g., about 0.2 V, about 0.25 V about 0.3 V, about 0.35 V, about 0.4 V, or about 0.45 V greater) than the threshold voltages of the non-polysilicon gate structures. In some embodiments, the reverse-bias leakage current of polysilicon gate structure 104A can be at least about 5 orders of magnitude smaller than the reverse-bias leakage currents of the non-polysilicon gate structures. In some embodiments, the reverse-bias leakage current of polysilicon gate structure 104A can be about 5 orders to about 10 orders (e.g., about 6 orders, about 7 orders, about 8 orders, or about 9 orders) of magnitude smaller than the reverse-bias leakage currents of the non-polysilicon gate structures. The higher threshold voltages and smaller reverse-bias leakage currents can provide more efficient and reliable electrical isolation between finFETs 102A-102B than that achieved with the non-polysilicon gate structures.

Such high threshold voltages and small reverse-bias leakage currents can be achieved in polysilicon gate structure 104A without the complexities of depositing work function metals in a poly gate replacement process as described in further detail below. As such, isolation structure 104 with polysilicon gate structure 104A can be fabricated with fewer process steps and at lower manufacturing costs than the non-polysilicon gate structures with aspect ratios and gate lengths similar to polysilicon gate structure 104A.

In some embodiments, threshold voltage of polysilicon gate structure 104A can be about 0.1 V to about 0.5 V greater (e.g., about 0.2 V, about 0.25 V about 0.3 V, about 0.35 V, about 0.4 V, or about 0.45 V greater) than threshold voltages of gate structures 112. In some embodiments, work function value of polysilicon gate structure 104 can be greater than work function values of gate structures 112. Even though isolation structure 104 is shown here to include a non-planar polysilicon gate structure 104A for electrically isolating non-planar FETs, isolation structure 104 can include a planar polysilicon gate structure for electrically isolating planar FETs. In addition, finFETs 102A-102B and isolation structure 104 can be incorporated into an integrated circuit through the use of other structural components, such as gate contact structures, S/D contact structures, conductive vias, conductive lines, interconnect metal layers, dielectric layers, passivation layers, etc., which are not shown for the sake of clarity.

Referring to FIGS. 1A-1E, semiconductor device 100 can further include etch stop layer (ESL) 116, interlayer dielectric (ILD) layer 118, and shallow trench isolation (STI) regions 138. ESL 116 can be configured to protect gate structures 112, isolation structure 104, and/or epitaxial fin regions 110. This protection can be provided, for example, during formation of ILD layer 118 and/or S/D contact structures (not shown). ESL 116 can be disposed on sidewalls of spacers 114 and 104B. In some embodiments, ESL 116 can include, for example, silicon nitride ($SiN_x$), silicon oxide ($SiO_x$), silicon oxynitride (SiON), silicon carbide (SiC), silicon carbo-nitride (SiCN), boron nitride (BN), silicon boron nitride (SiBN), silicon carbon boron nitride (SiCBN), or a combination thereof. In some embodiments, ESL 116 can include silicon nitride or silicon oxide formed by low pressure chemical vapor deposition (LPCVD), plasma enhanced chemical vapor deposition (PECVD), chemical vapor deposition (CVD), or silicon oxide formed by a high-aspect-ratio process (HARP). In some embodiments, ESL 116 can have a thickness ranging from about 3 nm to about 30 nm. Other materials, formation methods, and thicknesses for ESL 116 are within the scope and spirit of this disclosure.

ILD layer 118 can be disposed on ESL 116 and can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using flowable CVD (FCVD). In some embodiments, the dielectric material is silicon oxide. In some embodiments, ILD layer 118 can have a thickness in a range from about 50 nm to about 200 nm. Other materials, thicknesses, and formation methods for ILD layer 118 are within the scope and spirit of this disclosure.

STI regions 138 can be configured to provide electrical isolation between finFETs 102A-102B with fin structure 108 and neighboring finFETs with different fin structures (not shown) on substrate 106 and/or neighboring active and passive elements (not shown) integrated with or deposited on substrate 106. In some embodiments, STI regions 138 can include first and second protective liners 138A-138B and an insulating layer 138C disposed on second protective liner 138B. First and second protective liners 138A-138B can include materials different from each other. Each of first and second protective liners 138A-138B can include an oxide or nitride material. In some embodiments, first protective liner 138A can include a nitride material and second protective liner 138B can include an oxide material and can prevent oxidation of the sidewalls of stacked fin portion 108B during the formation of insulating layer 138C. In some embodiments, insulating layer 138C can include silicon oxide, silicon nitride, silicon oxynitride, fluorine-doped silicate glass (FSG), a low-k dielectric material, and/or other suitable insulating materials. In some embodiments, first and second protective liners 138A-138B each can have a thickness ranging from about 1 nm to about 2 nm. In some embodiments, STI regions 138 can have a vertical dimension 138H (e.g., height) along a Z-axis ranging from about 40 nm to about 60 nm (e.g., about 45 nm, about 50 nm, or about 55 nm). In some embodiments, vertical dimension $138_H$ can be half of the total height $H_T$ of fin structure 108.

Based on the disclosure herein, it will be recognized that cross-sectional shapes of semiconductor device 100 and its elements (e.g., fin structure 108, gate structures 112, epitaxial fin regions 110, isolation structure 104, spacers 114 and 104B, and/or STI regions 138) are illustrative and are not intended to be limiting.

Figure 2:
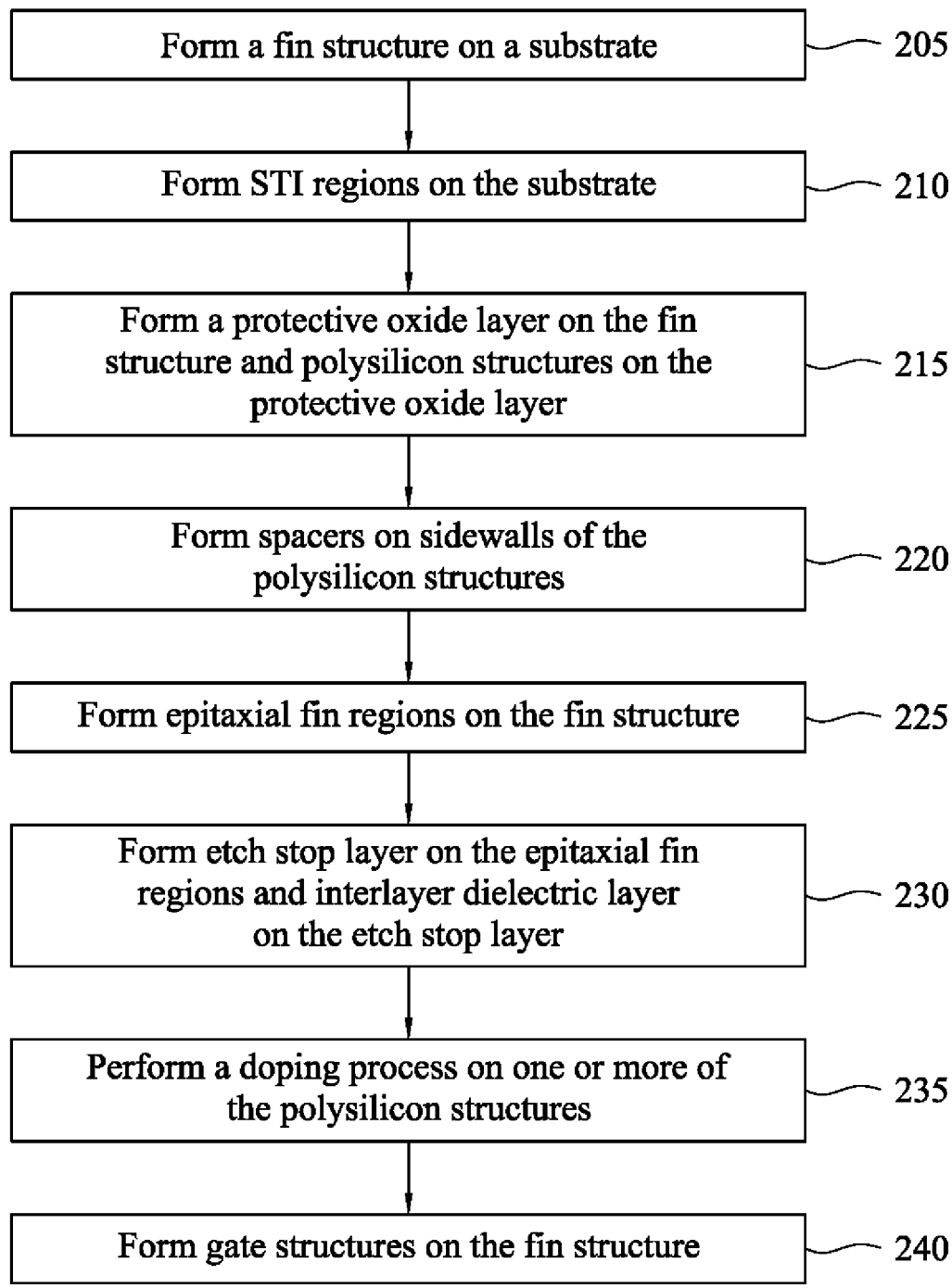
FIG. 2 is a flow diagram of a method for fabricating a semiconductor device with an isolation structure, in accordance with some embodiments.

FIG. 2 is a flow diagram of an example method 200 for fabricating semiconductor device 100, according to some embodiments. For illustrative purposes, the operations illustrated in FIG. 200 will be described with reference to the example fabrication process for fabricating semiconductor device 100 as illustrated in FIGS. 3A-12A, 3B-12B, 3C-12C, 6D-12D, and 10E-12E. FIGS. 3A-12A are isometric views of semiconductor device 100 at various stages of its fabrication. FIGS. 3B-12B and 3C-12C are cross-sectional views along lines B-B and C-C of structures of FIGS. 3A-12A, respectively, according to some embodiments. FIGS. 6D-12D are cross-sectional views along line D-D of respective structures of FIGS. 6A-12A, according to some embodiments. FIGS. 10E-12E are cross-sectional views along line E-E of respective structures of FIGS. 10E-12E, according to some embodiments. Operations can be performed in a different order or not performed depending on specific applications. It should be noted that method 200 may not produce a complete semiconductor device 100. Accordingly, it is understood that additional processes can be provided before, during, and after method 200, and that some other processes may only be briefly described herein. Elements in FIGS. 3A-12A, 3B-12B, 3C-12C, 6D-12D, and 10E-12E with the same annotations as elements in FIGS. 1A-1E are described above.

Figure 3A:
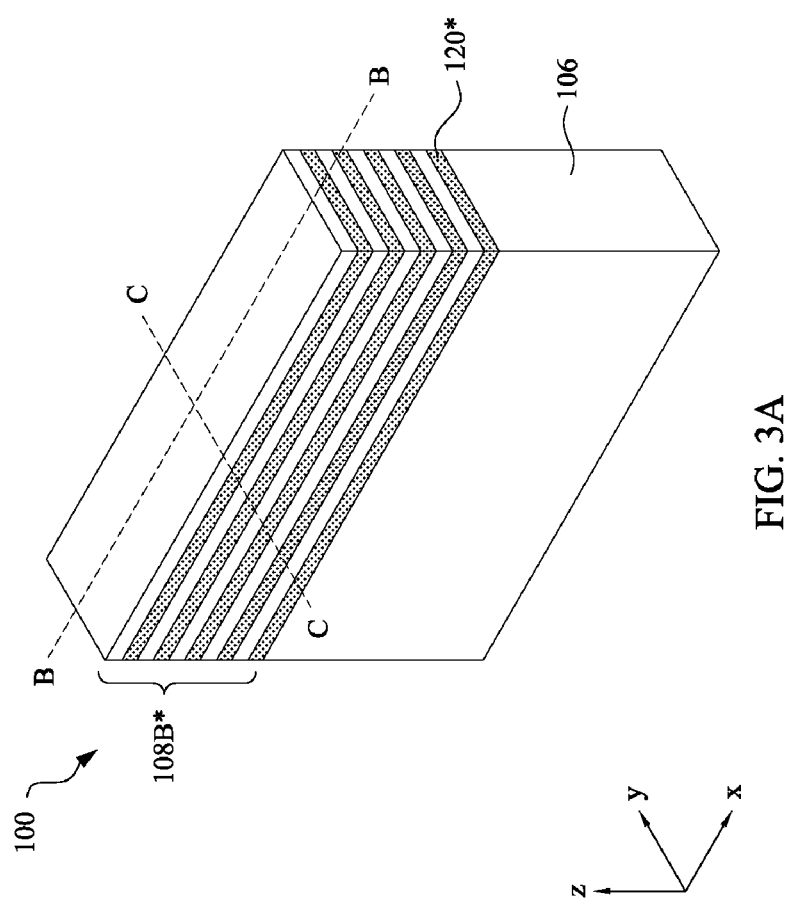
Figure 3C:
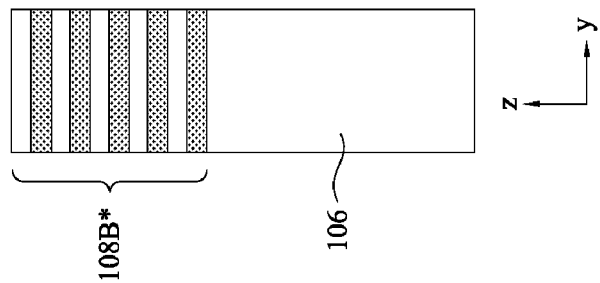
Figure 3B:
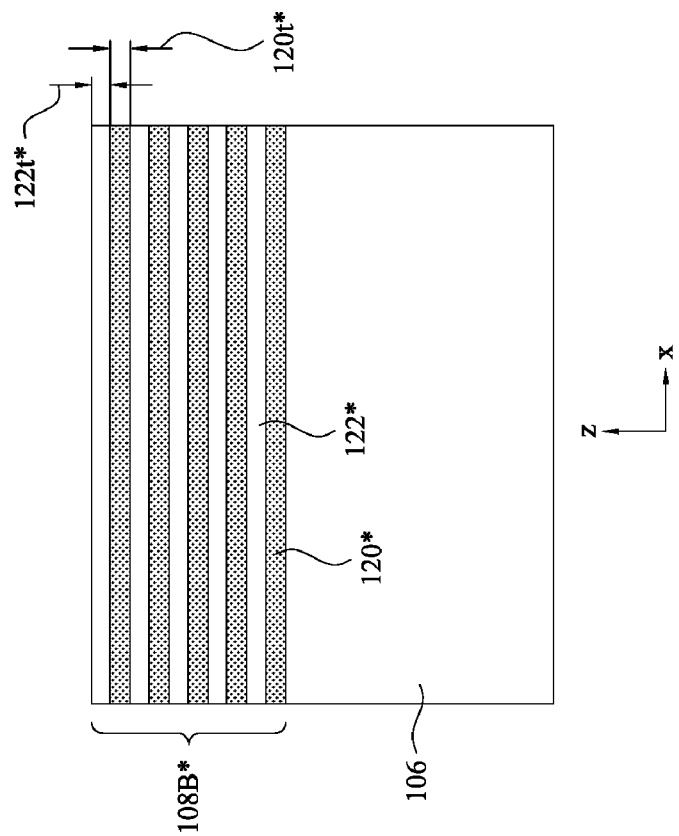
Figure 4A:
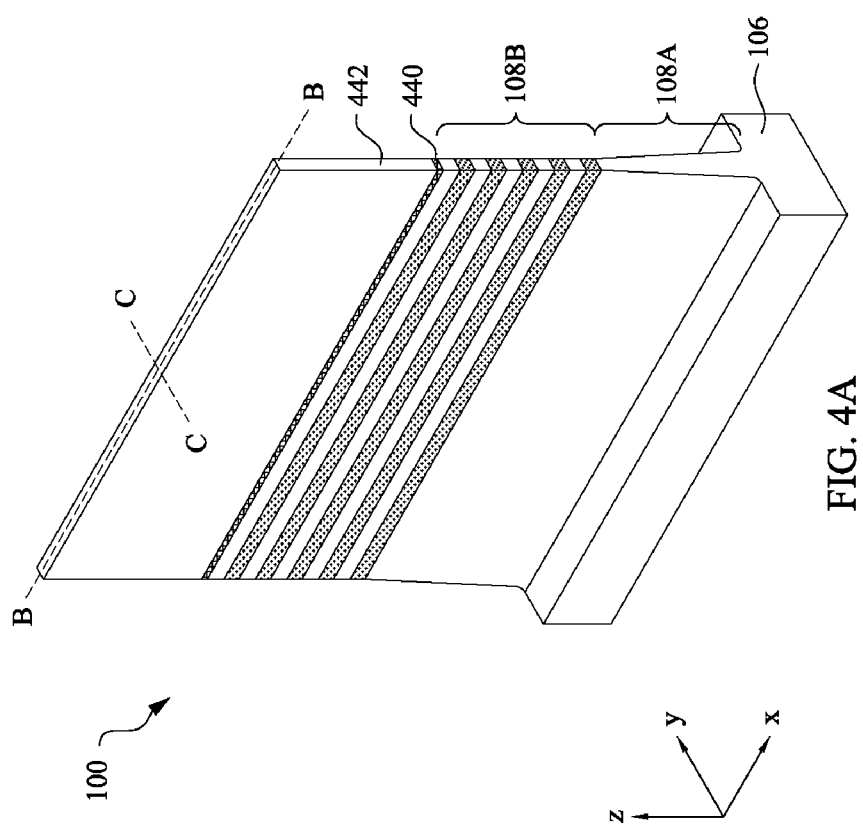

In operation 205, a fin structure is formed on a substrate. For example, fin structure 108 (shown in FIG. 4A) with fin base portion 108A and stacked fin portion 108B can be formed on substrate 106 as described with reference to FIGS. 3A-4C. The formation of fin structure 108 can include the formation of a stacked layer 108B* on substrate 106 as shown in FIGS. 3A-3C. Stacked layer 108B* can include first and second semiconductor layers 120* and 122* stacked in an alternating configuration. Each of first and second semiconductor layers 120* and 122* can be epitaxially grown on its underlying layer and can include semiconductor materials different from each other. In some embodiments, first and second semiconductor layers 120* and 122* can include semiconductor materials with oxidation rates and/or etch selectivity different from each other.

In some embodiments, first and second semiconductor layers 120* and 122* can include materials similar to or different from substrate 106. In some embodiments, each of first and second semiconductor layers 120* and 122* can include silicon germanium (SiGe) with Ge in a range from about 25 atomic percent to about 50 atomic percent (e.g., about 30 atomic percent, 35 atomic percent, or about 45 atomic percent) with any remaining atomic percent being Si or can include Si without any substantial amount of Ge.

First and/or second semiconductor layers 120* and 122* can be undoped or can be in-situ doped during their epitaxial growth process using (i) p-type dopants, such as boron, indium, or gallium; and/or (ii) n-type dopants, such as phosphorus or arsenic. For p-type in-situ doping, p-type doping precursors, such as diborane ($B_2H_6$), boron trifluoride ($BF_3$), and/or other p-type doping precursors can be used. For n-type in-situ doping, n-type doping precursors, such as phosphine ($PH_3$), arsine ($AsH_3$), and/or other n-type doping precursor can be used. First and second semiconductor layers 120* and 122* can have respective vertical dimensions 120t* and 122t* (e.g., thicknesses) along a Z-axis, each ranging from about 6 nm to about 10 nm (e.g., about 7 nm, about 8 nm, or about 9.5 nm). Vertical dimensions 120t* and 122t* can be equal to or different from each other.

The formation of fin structure 108 can further include etching the structure of FIG. 3A through patterned hard mask layers 440 and 442 (shown in FIGS. 4A-4C) formed on stacked layer 108B* of FIG. 3A. In some embodiments, hard mask layer 440 can be a thin film including silicon oxide formed, for example, using a thermal oxidation process. In some embodiments, hard mask layer 442 can be formed of silicon nitride using, for example, low pressure chemical vapor deposition (LPCVD) or plasma enhanced CVD (PECVD). The etching of the structure of FIG. 3A can include a dry etch, a wet etch process, or a combination thereof. The dry etch process can include using etchants having an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable etching gases and/or plasmas, or combinations thereof. The wet etch process can include etching in diluted hydrofluoric acid (DHF), potassium hydroxide (KOH) solution, ammonia, a solution containing hydrofluoric acid (HF), nitric acid ($HNO_3$), acetic acid ($CH_3COOH$), or combinations thereof.

In some embodiments, fin base portion 108A and stacked fin portion 108B can have respective vertical dimensions $H_1$ and $H_2$ (e.g., heights) along a Z-axis, each ranging from about 40 nm to about 60 nm (e.g., about 45 nm, about 50 nm, or about 55 nm). Vertical dimensions $H_1$ and $H_2$ can be equal to or different from each other and can have values such that the sum of $H_1$ and $H_2$ (i.e., total height $H_T$ of fin structure 108) ranges from about 80 nm to about 120 nm (e.g., about 85 nm, about 90 nm, about 100 nm, or about 115 nm). In some embodiments, fin structure 108 can have a horizontal dimension $L_1$ (e.g., length) along an X-axis ranging from about 100 nm to about 1 μm (e.g., about 200 nm, about 300 nm, about 500 nm, about 750 nm, or about 900 nm). In some embodiments, fin structure 108 can have a tapered cross-section along a YZ-plane with a horizontal dimension $W_1$ (e.g., width) of fin base portion 108B along a Y-axis being greater than a horizontal dimension $W_2$ of stacked fin portion 108B along a Y-axis. Horizontal dimension $W_1$ and $W_2$ can range from about 6 nm to about 20 nm (e.g., about 6 nm, about 8 nm, about 10 nm, about 15 nm, about 17 nm, or about 20 nm).

Figure 5A:
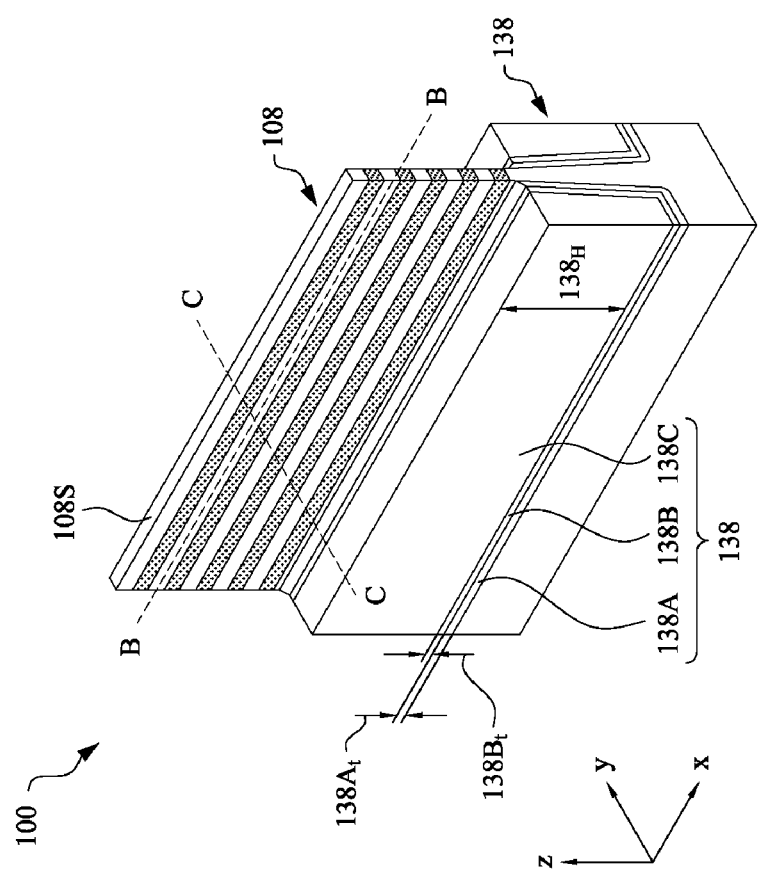
Figure 5C:
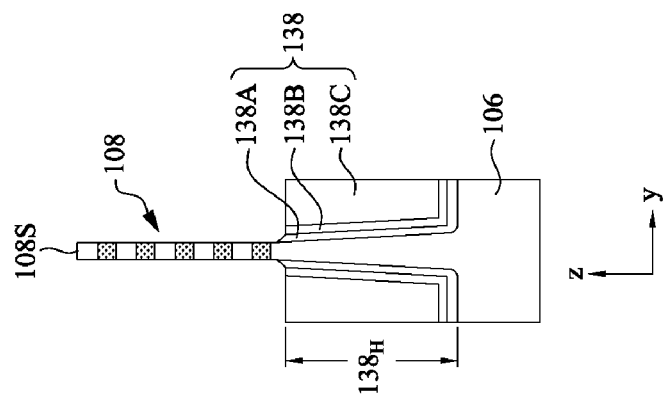
Figure 5B:
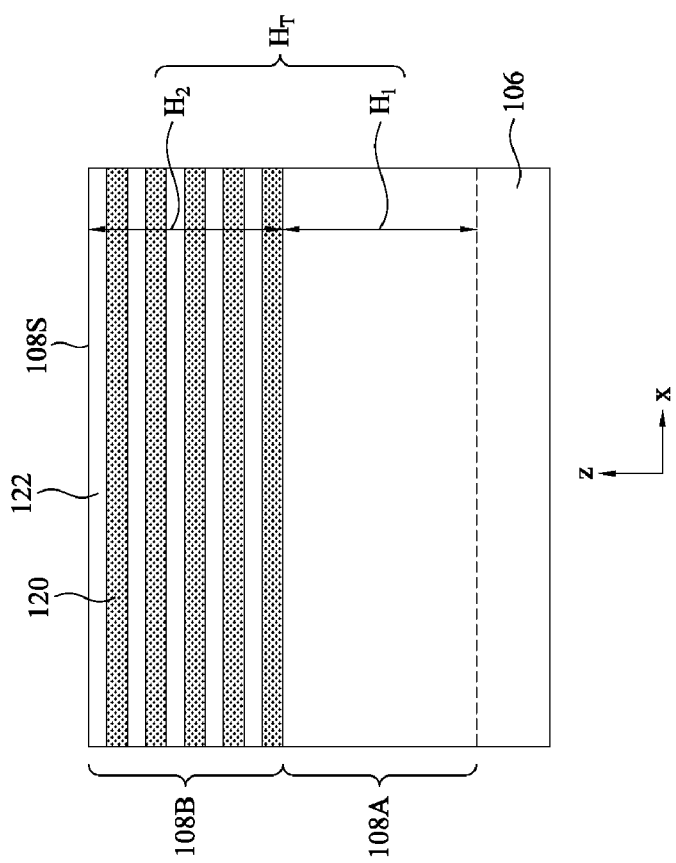
Figure 6A:
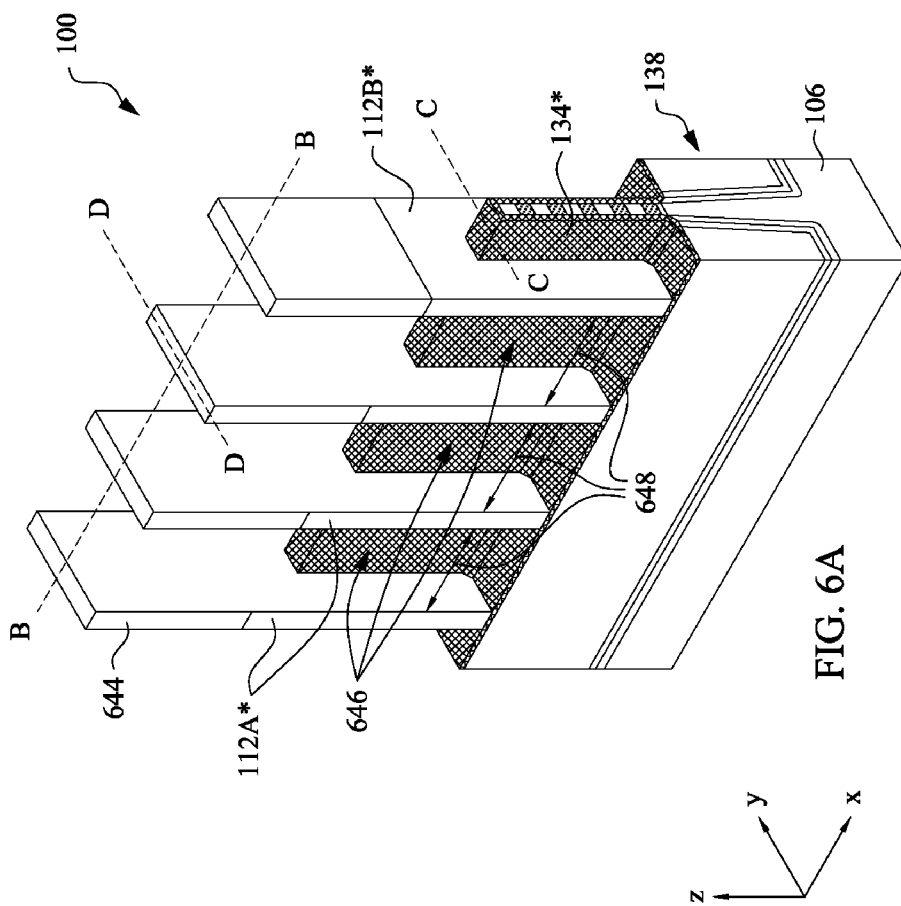
Figure 6B:
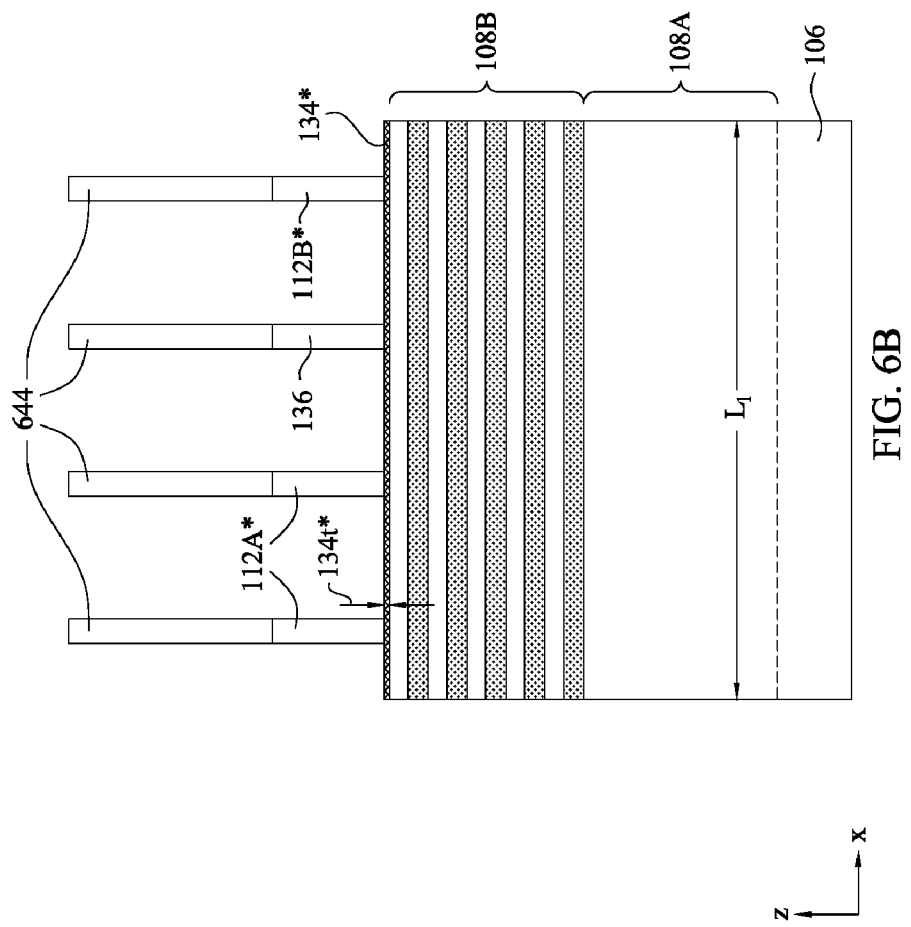
Figure 7A:
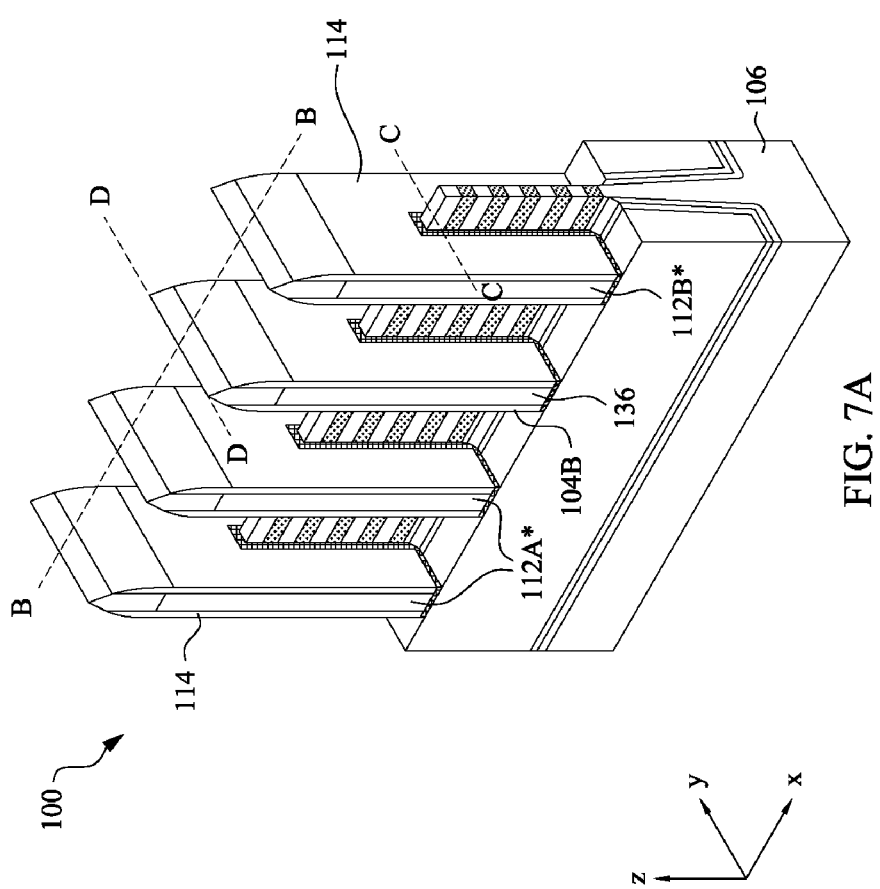
Figure 7B:
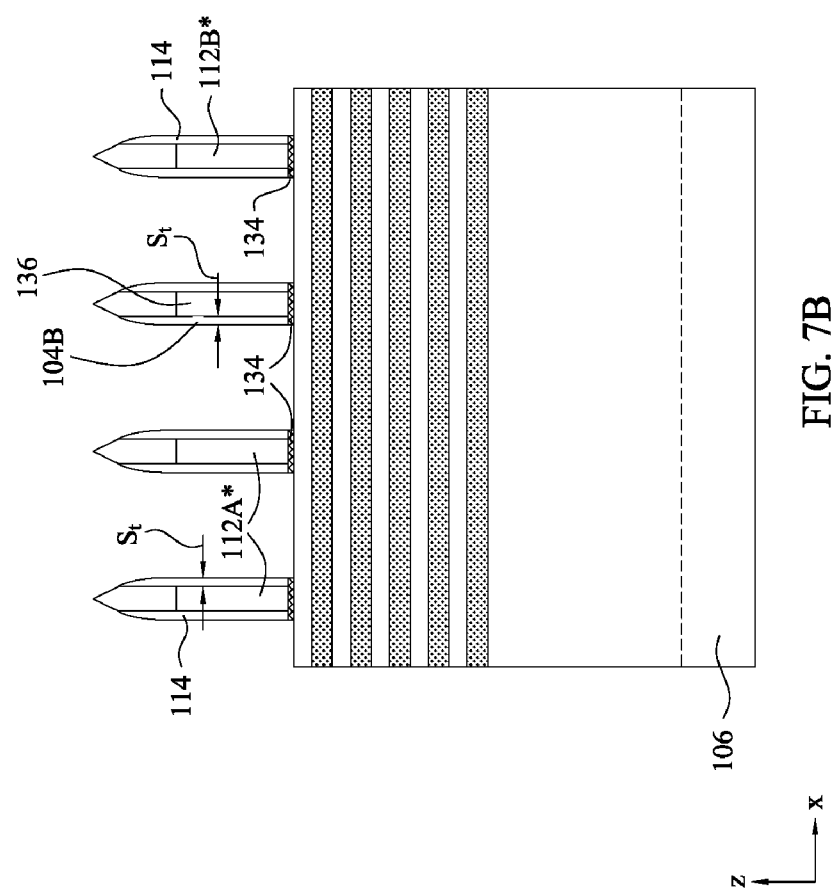
Figure 7D:
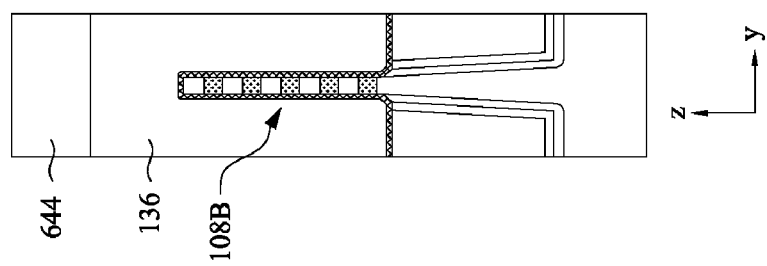
Figure 7C:
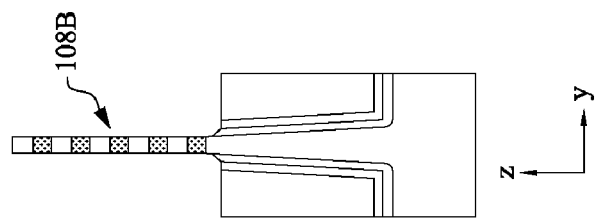

Referring to FIG. 2, in operation 210, STI regions are formed on the substrate. For example, as shown in FIGS. 5A-5C, STI regions 138 with first and second protective liners 138A-138B and insulating layer 138C can be formed on substrate 106. The formation of STI regions 138 can include (i) depositing a layer of nitride material (not shown) for first protective liners 138A on the structure of FIG. 4A, (ii) depositing a layer of oxide material (not shown) for second protective liners 138B on the layer of nitride material, (iii) depositing a layer of insulating material for insulating layers 138C on the layer of oxide material, (iv) annealing the layer of insulating material for insulating layer 138C, (v) chemical mechanical polishing (CMP) the layers of nitride and oxide materials and the annealed layer of insulating material, and (vi) etching back the polished structure to form the structure of FIG. 5A.

The layers of nitride and oxide materials can be deposited using a suitable process for depositing oxide and nitride materials, such as ALD or CVD. These layers of oxide and nitride materials can prevent oxidation of the sidewalls of stacked fin portion 108B during the deposition and annealing of the insulating material for insulating layer 138C.

In some embodiments, the layer of insulating material for insulating layer 138C can include silicon oxide, silicon nitride, silicon oxynitride, fluoride-doped silicate glass (FSG), or a low-k dielectric material. In some embodiments, the layer of insulating material can be deposited using a CVD process, a high-density-plasma (HDP) CVD process, using silane (SiH4) and oxygen ($O_2$) as reacting precursors. In some embodiments, layer of insulating material can be formed using a sub-atmospheric CVD (SACVD) process or high aspect-ratio process (HARP), where process gases can include tetraethoxysilane (TEOS) and/or ozone ($O_3$).

In some embodiments, the layer of insulating material can be formed by depositing flowable silicon oxide using a flowable CVD (FCVD) process. The FCVD process can be followed by a wet anneal process. The wet anneal process can include annealing the deposited layer of insulating material in steam at a temperature in a range from about 200° C. to about 700° C. for a period in a range from about 30 min to about 120 min. The wet anneal process can be followed by the CMP process to remove the patterned hard mask layers 440 and 442 and portions of the layers of nitride, oxide, and insulating materials for layers 138A-138C to substantially coplanarize top surfaces of the layers of nitride, oxide, and insulating materials with top surface 108s (FIGS. 5A-5C) of fin structure 108. The CMP process can be followed by the etching process to etch back the layers of nitride, oxide, and insulating materials to form the structure of FIG. 5A.

The etch back of the layers of nitride, oxide, and insulating materials can be performed by a dry etch process, a wet etch process, or a combination thereof. In some embodiments, the dry etch process can include using a plasma dry etch with a gas mixture having octafluorocyclobutane ($C_4F_8$), argon (Ar), oxygen ($O_2$), and helium (He), fluoroform ($CHF_3$) and He, carbon tetrafluoride ($CF_4$), difluoromethane ($CH_2F_2$), chlorine ($Cl_2$), and $O_2$, hydrogen bromide (HBr), $O_2$, and He, or a combination thereof with a pressure ranging from about 1 mTorr to about 5 mTorr. In some embodiments, the wet etch process can include using a diluted hydrofluoric acid (DHF) treatment, an ammonium peroxide mixture (APM), a sulfuric peroxide mixture (SPM), hot deionized water (DI water), or a combination thereof. In some embodiments, the wet etch process can include using ammonia ($NH_3$) and hydrofluoric acid (HF) as etchants and inert gases, such as Ar, xenon (Xe), He, or a combination thereof. In some embodiments, the flow rate of HF and $NH_3$ used in the wet etch process can each range from about 10 sccm to about 100 sccm (e.g., about 20 sccm, 30 sccm, or 40 sccm). In some embodiments, the wet etch process can be performed at a pressure ranging from about 5 mTorr to about 100 mTorr (e.g., about 20 mTorr, about 30 mTorr, or about 40 mTorr) and a high temperature ranging from about 50° C. to about 120° C.

In some embodiments, first and second protective liners 138A-138B can have respective thicknesses 138At and 138Bt ranging from about 1 nm to about 2 nm. In some embodiments, STI regions 138 can have a vertical dimension $138_H$ (e.g., height) along a Z-axis ranging from about 40 nm to about 60 nm (e.g., about 45 nm, about 50 nm, or about 55 nm). In some embodiments, vertical dimension $138_H$ can be half of the total height $H_T$ of fin structure 108. Other materials, formation methods, and dimensions for STI regions 138 are within the scope and spirit of this disclosure.

Referring to FIG. 2, in operation 215, a protective oxide layer is formed on the fin structure and polysilicon structures are formed on the protective oxide layer. For example, as shown in FIGS. 6A-6D, a protective oxide layer 134* can be formed on fin structure 108 and STI regions 138 and polysilicon structures 112A*-112B* and 136 can be formed on protective oxide layer 134*. The formation of protective oxide layer 134* can include blanket depositing a layer of oxide material on the structure of FIG. 5A followed by a high temperature anneal process. Protective oxide layer 134* can include a suitable oxide material, such as silicon oxide and can be blanket deposited using a suitable deposition process, such as CVD, ALD, plasma enhanced ALD (PEALD), physical vapor deposition (PVD), or e-beam evaporation. In some embodiments, the layer of oxide material can be deposited using PEALD at an energy ranging from about 400 W to about 500 W and at a temperature ranging from about 300° C. to about 500° C. The deposition of the layer of oxide material can be followed by a dry anneal process under oxygen gas flow at a temperature ranging from about 800° C. to about 1050° C. The oxygen precursor concentration can be in a range of about 0.5% to about 5% of the total gas flow rate. In some embodiments, the anneal process can be a flash process where the anneal time can be between about 0.5 s to about 5 s (e.g., about 1 s, about 2 s, about or about 5 s).

In some embodiments, protective oxide layer 134* can have a vertical dimension 134t* (e.g., thickness on top surface of fin structure 108) along a Z-axis and a horizontal dimension 134s* (e.g., thickness on sidewalls of stacked fin portion 108B) along a Y-axis each ranging from about 1 nm to about 3 nm (e.g., about 1 nm, or 2 nm). In some embodiments, dimension 134t* can be equal to or greater than dimension 134s*. Other oxide materials, formation methods, and thicknesses for protective oxide layer 134* are within the scope and spirit of this disclosure. The presence of protective oxide layer 134* allow etching polysilicon from high aspect ratio spaces 646 (e.g., aspect ratio greater than 1:15, 1:18, or 1:20) shown in FIG. 6A between adjacent polysilicon structures 112A*-112B* and 136 without substantially etching and/or damaging fin structure 108 during the formation of polysilicon structures 112A*-112B* and 136.

In some embodiments, protective oxide layer 134* can be removed during subsequent gate replacement process when finFETs 102A-102B are used as non-input/output (non-I/O) devices in core circuits (can be also referred to as "logic circuits" or "memory circuits") formed in core regions (can be also referred to as "logic regions" or "memory regions") of an integrated circuit (IC). In some embodiments, the non-I/O devices can be core devices, logic devices, and/or memory devices that are not configured to handle the input/output voltages/currents directly. In some embodiments, the non-I/O devices includes logic gates such as, for example, NAND, NOR, INVERTER, or a combination thereof. In some embodiments, the non-I/O devices include a memory device, such as a static random-access memory (SRAM) device. In some embodiments, protective oxide layer 134* may not be removed and can form a part of gate dielectric layers of gate structures 112 when finFETs 102A-102B are used as an I/O device in peripheral circuits (e.g., IO circuits) formed in peripheral regions (can be also referred to as "I/O regions" or "high voltage regions") of an IC. The I/O devices can be configured to handle the input/output voltages/currents of the IC and to tolerate a greater amount of voltage or current swing than the non-I/O devices.

The formation of protective oxide layer 134* can be followed by the formation of polysilicon structures 112A*-112B* and 136 as shown in FIGS. 6A-6D. During subsequent processing, polysilicon structure 136 along with the portion of protective oxide layer 134* underlying polysilicon structure 136 can form polysilicon gate structure 104A of isolation structure 104 and polysilicon structures 112A*-112B* can be replaced in a gate replacement process to form gate structures 112 of finFETs 102A-102B, respectively, as shown in FIG. 1A. In some embodiments, the formation of polysilicon structures 112A*-112B* and 136 can include blanket depositing a layer of polysilicon material on the deposited protective oxide layer 134* and etching the layer of polysilicon material through a patterned hard mask layer

644 (shown in FIGS. 6A-6D) formed on the layer of polysilicon material. In some embodiments, polysilicon material can be undoped and hard mask layer 644 can include an oxide layer and/or a nitride layer. The oxide layer can be formed using a thermal oxidation process and the nitride layer can be formed by LPCVD or PECVD. Hard mask layer 644 can protect polysilicon structures **112A\*-112B\* and 136 from subsequent processing steps (e.g., during formation of spacers 114 and 104B, epitaxial fin regions 110, ILD layer 118, and/or ESL 116**).

The blanket deposition of the layer of polysilicon material can include CVD, PVD, ALD, or other suitable deposition processes. In some embodiments, etching of the deposited layer of polysilicon material can include a dry etch, a wet etching, or a combination thereof. In some embodiments, etching of the deposited layer of polysilicon material to form polysilicon structures **112A\*-112B\* and 136 can include four etching steps. The first polysilicon etch step can include using a gas mixture having hydrogen bromide (HBr), oxygen ($O_2$), fluoroform ($CHF_3$), and chlorine ($Cl_2$). The second polysilicon etch step can include using a gas mixture having HBr, $O_2$, $Cl_2$, and nitrogen ($N_2$) at a pressure of about 45 mTorr to about 60 mTorr. The third polysilicon etch step can include using a gas mixture having HBr, $O_2$, $Cl_2$, $N_2$, and argon (Ar) at a pressure of about 45 mTorr to about 60 mTorr. The fourth polysilicon etch step can include using a gas mixture having HBr, $O_2$, $Cl_2$, and $N_2$ at a pressure of about 45 mTorr to about 60 mTorr. The first polysilicon etch step can have a higher polysilicon etch rate than the second, third, and/or fourth polysilicon etch steps. The first polysilicon etch step is used to etch unwanted portions of the blanket deposited layer of polysilicon material above fin structure 108. The second, third, and fourth polysilicon etch steps are used to etch unwanted portions of the blanket deposited layer of polysilicon material within high aspect ratio spaces 646**.

In some embodiments, vertical dimensions $G_H$ of polysilicon structures **112A\*-112B\* and 136 along a Z-axis can be in a range from about 100 nm to about 150 nm (e.g., about 100 nm, about 120 nm, about 135 nm, or 150 nm). In some embodiments, horizontal dimensions $G_L$ of polysilicon structures 112A\*-112B\* and 136 along an X-axis can be in a range from about 3 nm to about 30 nm (e.g., about 3 nm, about 5 nm, about 7 nm, about 10 nm, about 12 nm, about 15 nm, about 20 nm, or about 30 nm). Polysilicon structures 112A\*-112B\* and 136 can have a high aspect ratio equal to or greater than about 9 (e.g., about 10, about 12, about 15, about 18, or about 20), where aspect ratio is a ratio of dimension $G_H$ to dimension $G_L$. In some embodiments, horizontal dimensions 648 along an X-axis (e.g., spacing) between adjacent polysilicon structures 112A\*-112B\* and 136 can be in a range from about 40 nm to about 90 nm (e.g., about 40 nm, about 50 nm, about 60 nm, about 80 nm, or about 90 nm). The sum of a value of dimension 648 and a value of dimension $G_L$ is referred to as "one contacted poly pitch (1CPP)." In some embodiments, horizontal dimension $L_1$ of fin structure along an X-axis can be at least 3CPP to prevent the relaxation of strain in fin structure 108, and consequently, prevent the relaxation of strain in channel regions formed in second fin regions 122B under gate structures 112** as discussed above.

Referring to FIG. 2, in operation 220, spacers are formed on sidewalls of the polysilicon structures. For example, as shown in FIGS. 7A-7D, spacers 114 are formed on sidewalls of polysilicon structures **112A\*-112B\* and spacers 104B are formed on sidewalls of polysilicon structure 136. The formation of spacers 114 and 104B can include blanket depositing a layer of an insulating material (e.g., an oxide or a nitride material) on the structure of FIG. 6A by a CVD, a PVD, or an ALD process followed by photolithography and an etching process (e.g., reactive ion etching or other dry etching process using a chlorine or fluorine based etchant). Spacers 114 and 104B can each have a horizontal dimension St (e.g., thickness) along an X-axis ranging from about 6 nm to about 8 nm, according to some embodiments. The formation of spacers 114 and 104B can be followed by the formation of gate oxide layer 134 (shown in FIGS. 7A-7D) underlying polysilicon structures 112A\*-112B\* and 136 by etching protective oxide layer 134\* from regions not covered by polysilicon structures 112A\*-112B\* and 136 and spacers 114 and 104B**. The etch process can include a wet etch process using, for example, diluted HF.

Referring to FIG. 2, in operation 225, epitaxial fin regions are formed on the fin structure. For example, as shown in FIGS. 8A-8D, epitaxial fin regions 110 are formed on surfaces of stacked fin portion 108B of fin structure 108 not covered by polysilicon structures **112A\*-112B\* and 136 and spacers 114 and 104B. In some embodiments, epitaxial fin regions 110 can be grown by (i) CVD, such as low pressure CVD (LPCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, epitaxial fin regions 110 can be grown by an epitaxial deposition/partial etch process, which repeats the epitaxial deposition/partial etch process at least once. In some embodiments, epitaxial fin regions 110 can be grown by selective epitaxial growth (SEG), where an etching gas is added to promote the selective growth of semiconductor material on the exposed surfaces of stacked fin portion 108B, but not on insulating material (e.g., insulating material of STI regions 138 and/or of spacers 114 and 104B**).

In some embodiments, epitaxial fin regions 110 can be p-type or n-type. In some embodiments, p-type epitaxial fin regions 110 can include SiGe and can be in-situ doped during the epitaxial growth process using p-type dopants, such as boron, indium, or gallium. For p-type in-situ doping, p-type doping precursors such as, but not limited to, diborane (B2H6), boron trifluoride (BF3), and/or other p-type doping precursors can be used. In some embodiments, n-type epitaxial fin regions 110 can include Si without any substantial amount of Ge and can be in-situ doped during the epitaxial growth process using n-type dopants, such as phosphorus or arsenic. For n-type in-situ doping, n-type doping precursors such as, but not limited to, phosphine (PH3), arsine (AsH3), and/or other n-type doping precursor can be used.

Each epitaxial fin region 110 along its underlying first fin regions 120A and 122A of respective semiconductor layers 120 and 122 can form S/D regions 126. Second fin regions 122B of semiconductor layers 122 underlying polysilicon structures **112A\*-112B\* and interposed between adjacent S/D regions 126 can form the channel regions of finFETs 102A and/or 102B. In subsequent processing, gate-all-around structures can be formed to wrap around each of the channel regions by replacing second fin regions 120B underlying polysilicon structures 112A\*-112B\* with one or more layers of gate structures 112 as described below in operation 240**.

Figure 8D:
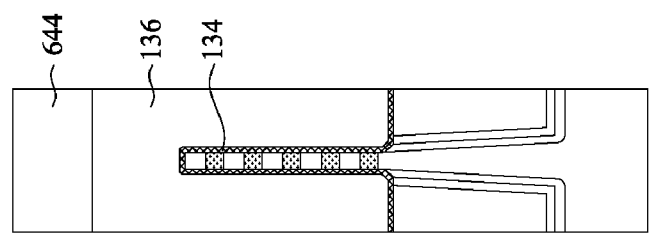
Figure 8C:
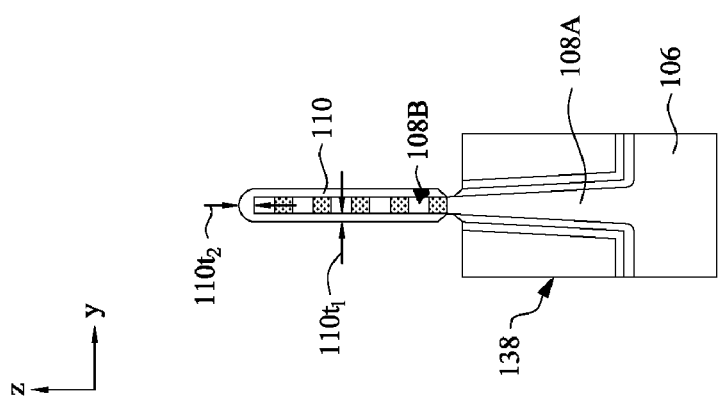

In some embodiments, epitaxial fin regions 110 can each have a thickness $110t_1$ along sidewalls of stacked fin portion 108B and a thickness $110t_2$ on top surface of stacked fin portion 108B. In some embodiments, thicknesses $110t_1$ and $110t_2$ can be equal to or different from each other. In some embodiments, each of thicknesses $110t_1$ and $110t_2$ can range from about 3 nm to about 6 nm (e.g., about 3.5 nm, about 4 nm, about 4.5 nm, or about 5 nm). In some embodiments, instead of each epitaxial fin region 110 having a substantially uniform thickness $110t_1$ along sidewalls of stacked fin portion 108B (shown in FIG. 8C), each epitaxial fin regions 110 can have a non-uniform thickness along sidewalls of stacked fin portion 108B as shown in FIG. 8D.

Figure 8F:
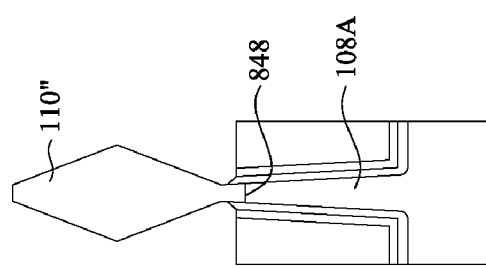
FIGS. 8E-8F illustrate cross-sectional views of a semiconductor device with various configurations of epitaxial fin regions on fin structures, in accordance with some embodiments.
Figure 8E:
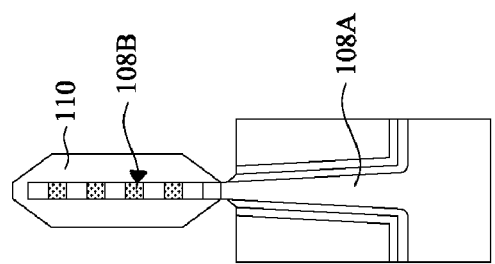

In some embodiments, instead of epitaxial fin regions 110 and underlying first and second fin regions 120A and 122A of stacked fin portion 108B forming S/D regions 126, epitaxial fin regions 110" as shown in FIG. 8F can form S/D regions of finFETs 102A-102B. The epitaxial fin regions 110" can be formed after the formation of spacers 114 and 104B followed by etch back of the portions of stacked fin portion 108B not covered by polysilicon structures 112A*-112B* and 136 and spacers 114 and 104B. In some embodiments, a biased etching process can be performed to etch back these portions of stacked fin portion 108B. The etching process can be performed under a pressure of about 1 mTorr to about 1000 mTorr, a power of about 50 W to about 1000 W, a bias voltage of about 20 V to about 500 V, at a temperature of about 40° C. to about 60° C., and using HBr and/or $Cl_2$ as etch gases. During the etching process, polysilicon structures 112A*-112B* and 136 can be protected from being etched by hard mask layer 644 and spacers 114 and 104B.

In some embodiments, fin base portion 108A underlying the etched portions of stacked fin portion 108B can be recessed during the etch back process. The etch back process can be followed by the epitaxial growth of epitaxial fin regions 110" on the exposed or recessed portions of fin base portion 108A underlying the etched portions of stacked fin portion 108B. In some embodiments, epitaxial fin regions 110" can be grown and/or doped in any of the growth and doping processes discussed above for epitaxial fin regions 110. Interfaces 848 between epitaxial fin regions 110" and fin base portion 108A can be on the same plane as top surfaces of STI regions 138 or can be below the top surface planes of STI regions 138 as shown in FIG. 8F. Other dimensions and structures for epitaxial fin regions 110 and/or 110" are within the scope and spirit of this disclosure.

Referring to FIG. 2, in operation 230, an etch stop layer (ESL) is formed on the epitaxial fin regions and an interlayer dielectric (ILD) layer is formed on the ESL. For example, as shown in FIGS. 9A-9D, ESL 116 can be disposed on epitaxial fin regions 110, spacers 114 and 104B, and STI regions 138, and ILD layers 118 can be disposed on ESL 116. In some embodiments, ESL 116 can be formed of materials including $SiN_x$, $SiO_x$, SiON, SiC, SiCN, BN, SiBN, SiCBN, or a combination thereof. The formation of ESL 116 can include blanket depositing a layer of material for ESL 116 on the structure of FIG. 8A using PECVD, sub atmospheric chemical vapor deposition (SACVD), LPCVD, ALD, high-density plasma (HDP), plasma enhanced atomic layer deposition (PEALD), molecular layer deposition (MLD), plasma impulse chemical vapor deposition (PICVD), or other suitable deposition methods.

The blanket deposition of the layer of material for ESL 116 can be followed by a blanket deposition of a layer of dielectric material for ILD 118. In some embodiments, the dielectric material can be silicon oxide. The layer of dielectric material can be deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using FCVD process. The blanket deposition process can be followed by a thermal annealing of the deposited layer of dielectric material in steam at a temperature ranging from about 200° C. to about 700° C. for a period ranging from about 30 minutes to about 120 minutes.

Figure 9A:
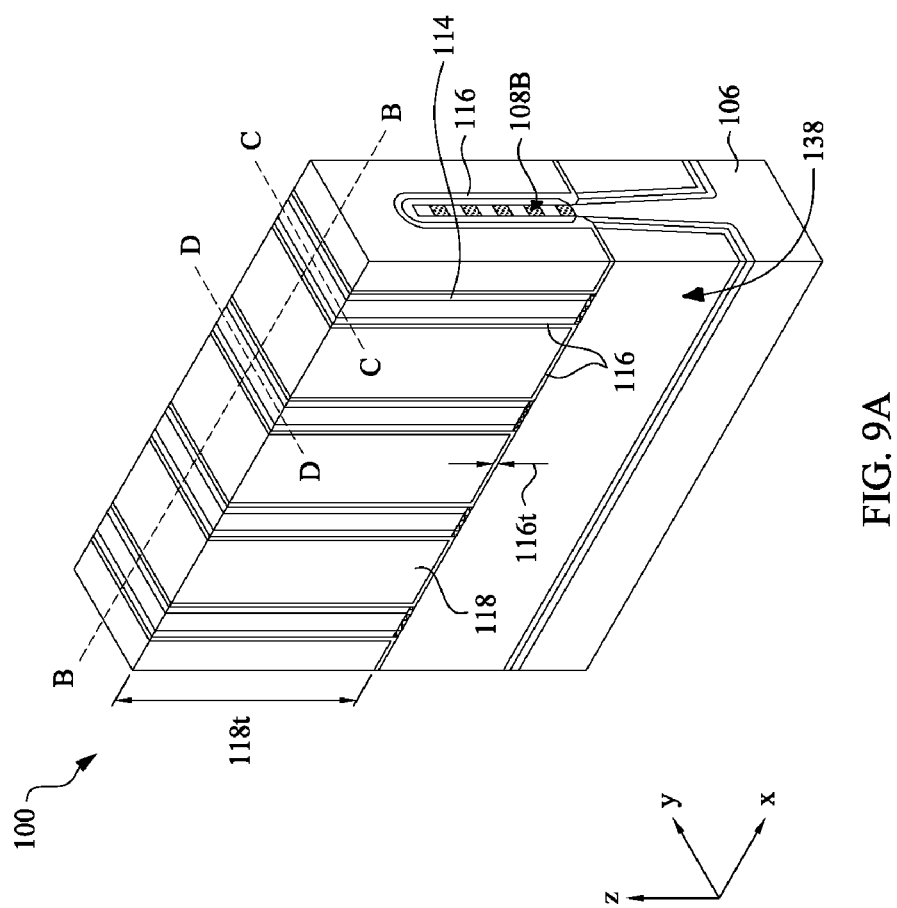

The thermal annealing can be followed by a CMP process to coplanarize top surfaces of ESL 116, ILD 118, spacers 114 and 104B, and polysilicon structures 112A*-112B* and 136 with each other as shown in FIG. 9A. During the CMP process, hard mask layer 644 can be removed. In some embodiments, ESL 116 can have a thickness 116t on epitaxial fin regions 110, spacers 114 and 104B, and STI regions 138 ranging from about 3 nm to about 30 nm. In some embodiments, ILD layer 118 can have a thickness 118t ranging from about 50 nm to about 200 nm.

Figure 9B:
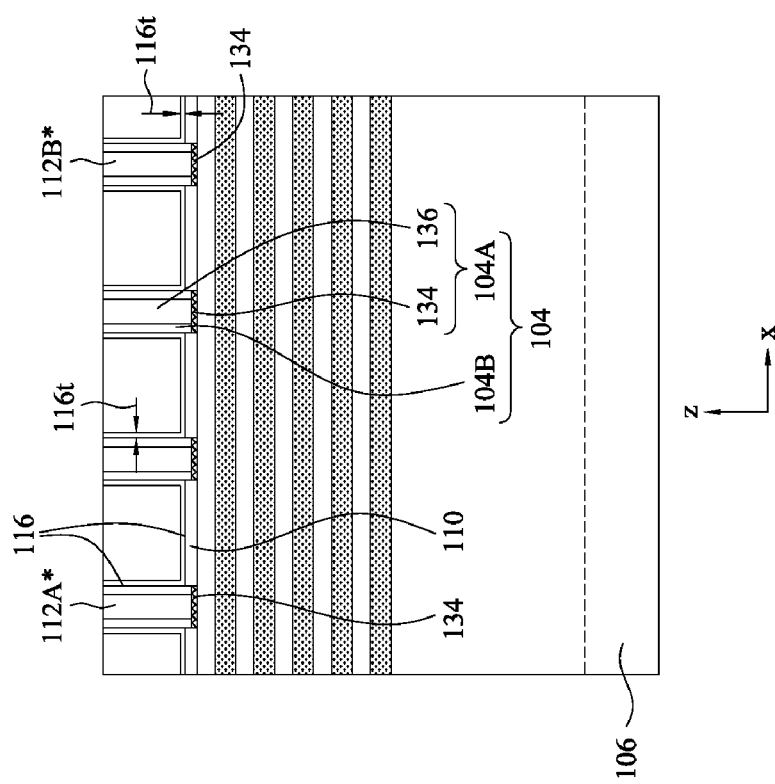
Figure 10A:
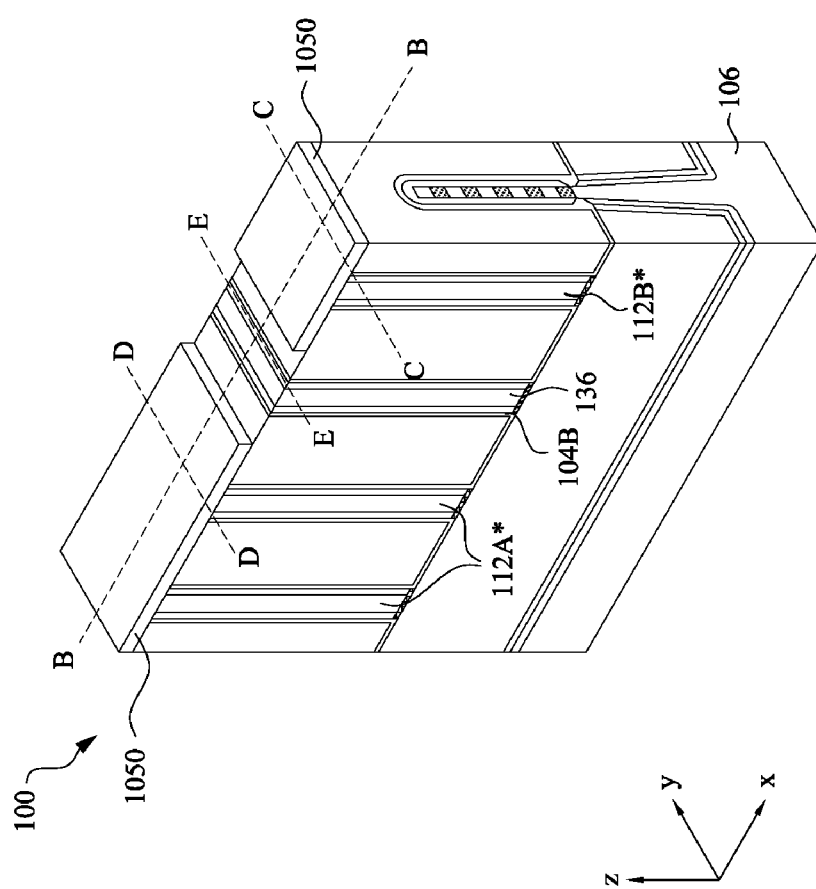
Figure 10B:
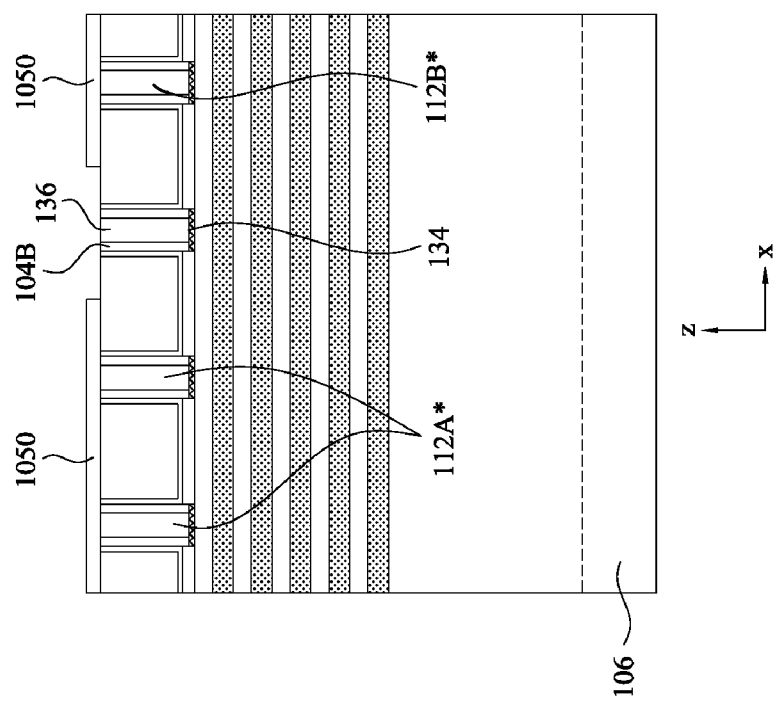
Figures 10C, 10D, 10E:
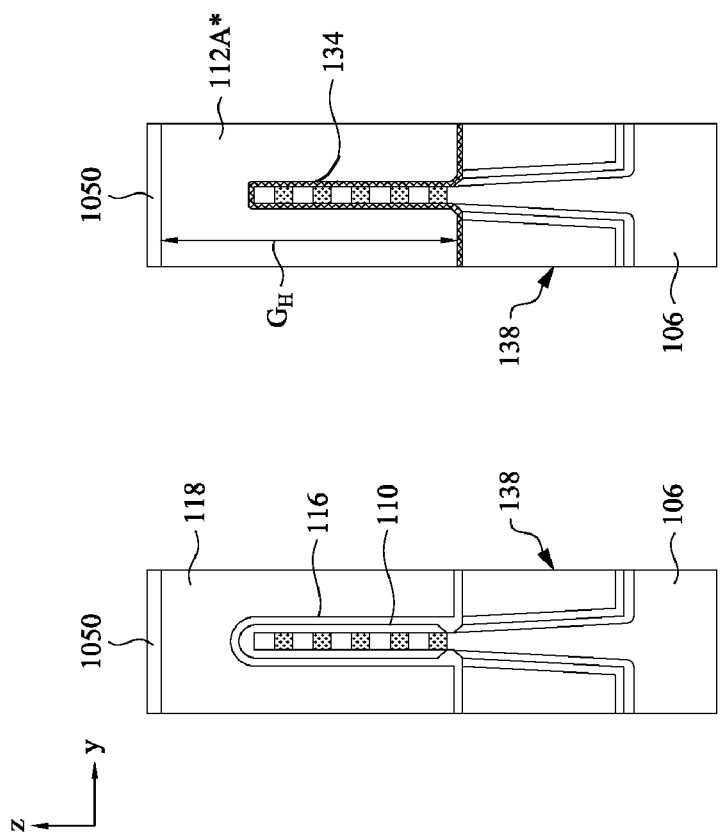

Following the CMP process, the resulting structure of polysilicon structure 136 on gate oxide layer 134 shown in FIGS. 9A-9B and 9D can form polysilicon gate structure 104A of isolation structure 104. Similarly, polysilicon structures 112A*-112B* on gate oxide layers 134 shown in FIGS. 9A-9B and 9D can form polysilicon gate structures, which can be replaced with metal gates in subsequent processing (e.g., in operation 240). In some embodiments, polysilicon structure 136 can be doped with p-type and/or n-type dopants as discussed below in operation 235 with reference to FIGS. 10A-10E. In some embodiments, the doping process of polysilicon structure 136 in operation 235 can be optional and the formation of isolation structure 104 as shown in FIGS. 9A-9B and 9D can be followed by the formation of gate structures 112 discussed below in operation 240.

Referring to FIG. 2, in operation 235, a doping process is performed on one or more of the polysilicon structures. For example, a doping process can be performed on polysilicon structure 136 as described with reference to FIGS. 10A-10E. The doping of polysilicon structure 136 can include patterning a photoresist (PR) layer 1050 on the structure of FIG. 9A to cover polysilicon structures 112A*-112B* as shown in FIGS. 10A-10D, doping the exposed polysilicon structure 136, and removing PR layer 1050. In some embodiments, the formation of patterned PR layer 1050 can be optional and the doping process can be performed on the structure of FIG. 9A without covering polysilicon structures 112A*-112B* with patterned PR layer 1050 when polysilicon structures 112A*-112B* are replaced with metal gate structures (e.g., gate structures 112 of FIG. 1A) in subsequent processing (e.g., operation 240).

The doping process can include ion implanting p-type dopants (e.g., as boron, indium, or gallium) and/or n-type dopants (e.g., phosphorus or arsenic) into polysilicon structure 136 followed by a thermal annealing of the ion implanted polysilicon structure 136. The thermal annealing can be performed at a temperature ranging from about 600° C. to about 1000° C. for a period of 1 μs to about 1 ms (e.g., about 1 μs, about 5 μs, about 10 μs, about 100 μs, about 200 μs, about 500 μs, about 750 μs, or about 1 ms). The doped polysilicon structure 136 can have a dopant concentration ranging from about $3\times10^{18}$ atoms/cm$^3$ to about $5\times10^{23}$ atoms/cm$^3$ (e.g. about $5\times10^{18}$ atoms/cm$^3$ to about $5\times10^{23}$ atoms/cm$^3$, about $1\times10^{19}$ atoms/cm$^3$ to about $1\times10^{22}$ atoms/cm$^3$, about $1\times10^{20}$ atoms/cm$^3$ to about $5\times10^{22}$ atoms/cm$^3$, about $5\times10^{18}$ atoms/cm$^3$, about $1\times10^{19}$ atoms/cm$^3$, about $5\times10^{19}$ atoms/cm$^3$, about $3\times10^{20}$ atoms/cm$^3$, about $7\times10^{20}$ atoms/cm$^3$, about $1\times10^{21}$ atoms/cm$^3$, about $5\times10^{21}$ atoms/cm$^3$, about $3\times10^{22}$ atoms/cm$^3$, about $8\times10^{22}$ atoms/cm$^3$, or about $1\times10^{23}$ atoms/cm$^3$).

Referring to FIG. 2, in operation 240, gate structures are formed on the fin structure. For example, gate structures 112 are formed wrapped around second fin regions 122B of stacked fin portion 108B of fin structure 108 as described with reference to FIGS. 11A-11E, 12A-12E, and 1A-1E. The formation of gate structures 112 can include forming a patterned PR layer 1152 on the structure of FIG. 10A after the removal of PR layer 1050 or, if operation 235 is not performed, on the structure of FIG. 9A to cover and protect polysilicon structure 136 (FIGS. 11A-11B and 11E) during the selective removal of polysilicon structures 112A*-112B*. The formation of PR layer 1152 can be followed by the selective removal of polysilicon structures 112A*-112B* to form the structure of FIGS. 11A-11E. The polysilicon structures 112A-112B* can be removed using a dry etching process (e.g., reaction ion etching) or a wet etching process. In some embodiments, the gas etchants used in the dry etching process can include chlorine, fluorine, bromine, or a combination thereof. In some embodiments, an ammonium hydroxide ($NH_4OH$), sodium hydroxide (NaOH), and/or potassium hydroxide (KOH) wet etch can be used to remove polysilicon structures 112A*-112B*, or a dry etch followed by a wet etch process can be used to remove polysilicon structures 112A*-112B*.

Figure 11A:
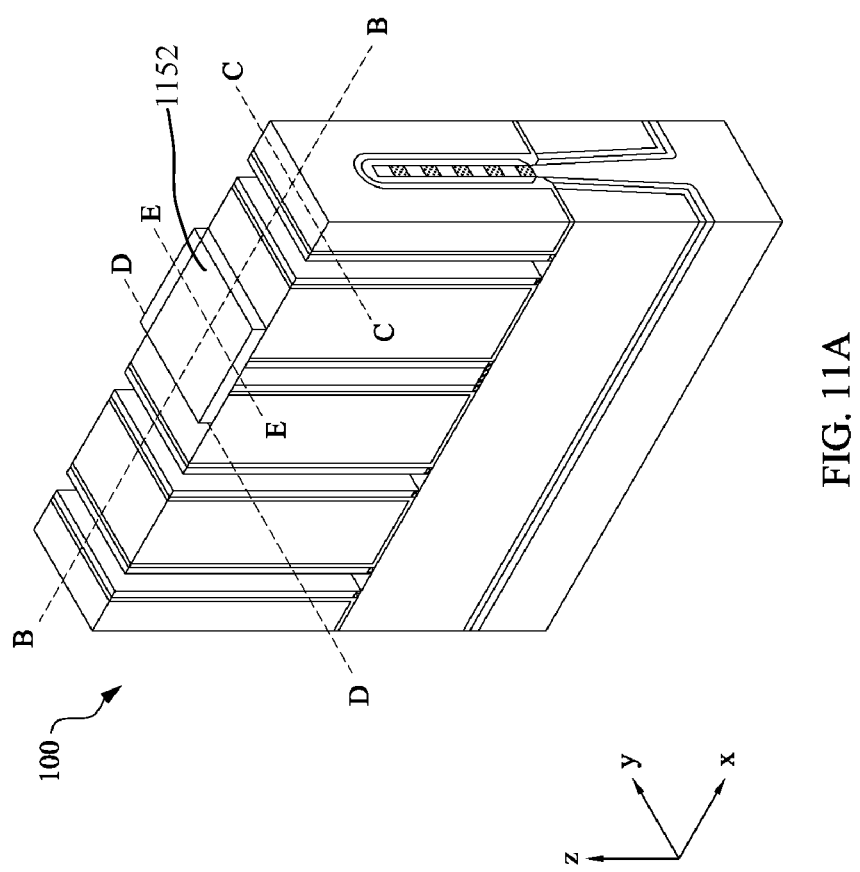
Figure 11B:
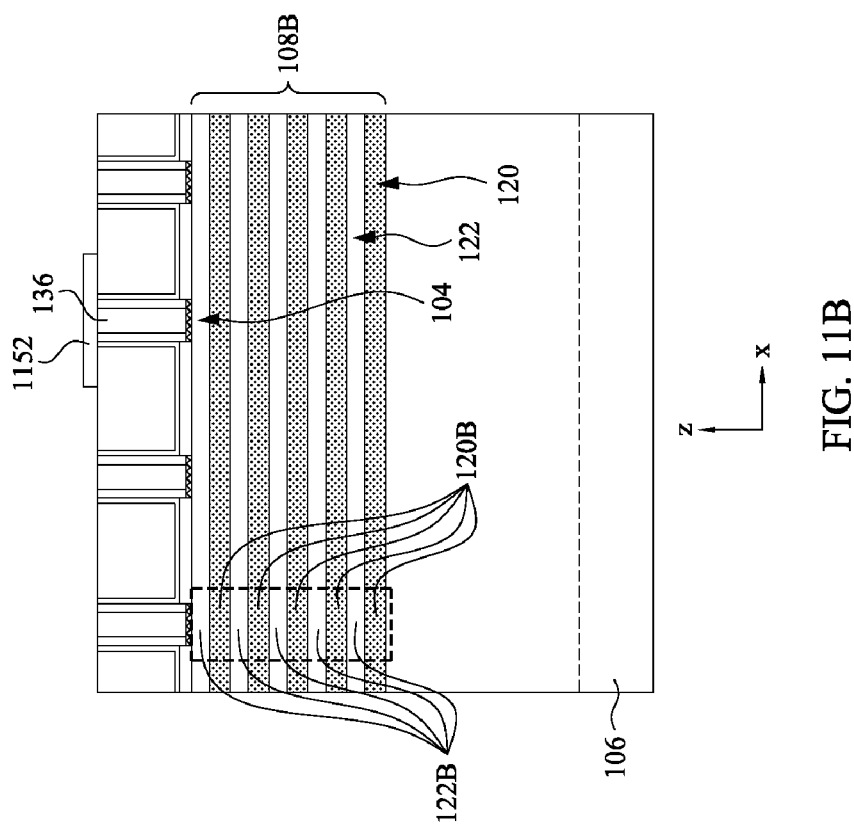

As shown in FIGS. 11B and 11D, the portions of gate oxide layer 134 underlying polysilicon structures 112A*-112B* can be exposed after the removal of polysilicon structures 112A*-112B*. The exposed portions of gate oxide layer 134 can be removed using a dry etching process (e.g., reaction ion etching), a wet etching process (e.g., using diluted HF), or a combination thereof. In some embodiments, the gas etchants used in the dry etching process can include chlorine, fluorine, bromine, or a combination thereof. The removal of the exposed portions of gate oxide layer 134 can be followed by the removal of PR layer 1152.

Figure 12A:
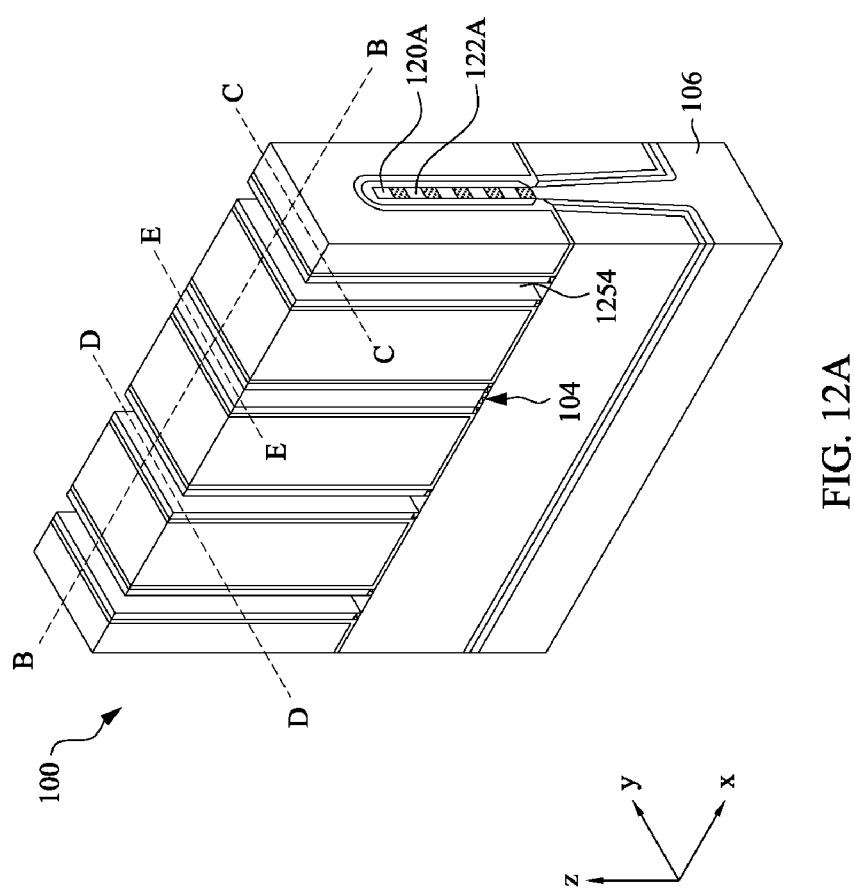
Figure 12B:
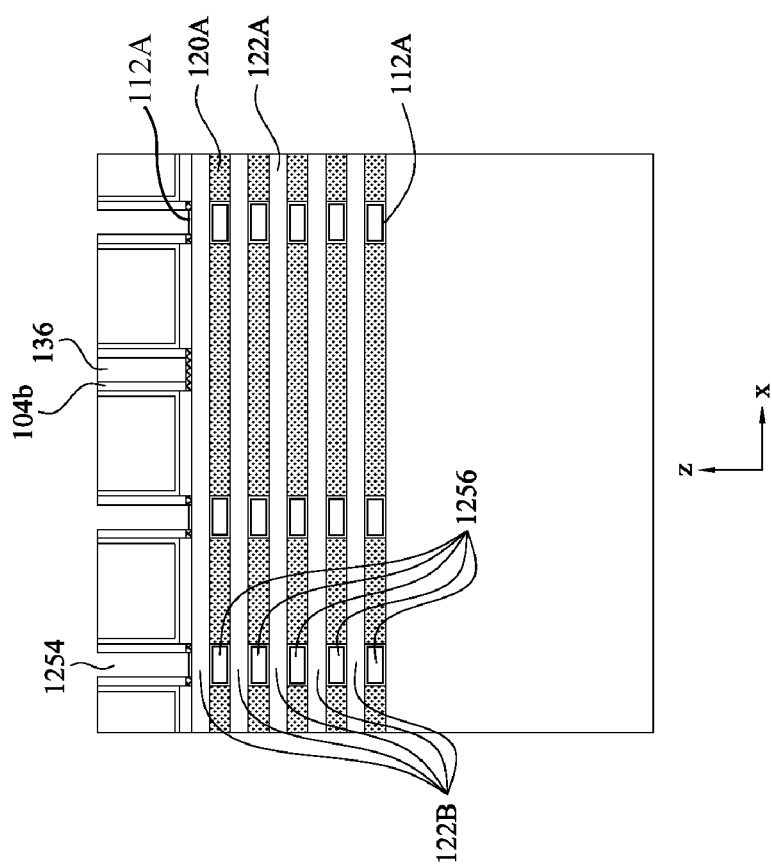

The removal of PR layer 1152 can be followed by an oxidation process to form oxide layer 112A on surfaces of second fin regions 122B of second semiconductor layers 122 of stacked fin portion 108B as shown in FIGS. 12B and 12D. An oxide layer (not shown) of negligible thickness can grow on first semiconductor layer 120 during the oxidation process, but of negligible thickness as oxidation rate of the material of semiconductor layers 122 can be higher than that of the material of semiconductor layers 120. Oxide layer 112A can be grown to protect second fin regions 122B during the selective removal of second fin regions 120B of semiconductor layers 120 of stacked fin portion 108B (shown in FIG. 11B) to form the structure of FIGS. 12A-12E. The oxidation process can include a thermal oxidation or an ozone based oxidation process performed at a temperature ranging from about 400° C. to about 600° C. (e.g., about 400° C., about 420° C., about 450° C., about 500° C., about 450° C., or about 600° C.) for a period ranging from about 2 min to about 4 hrs (e.g., about 2 min, about 5 min, about 10 min, about 30 min, about 1 hr, about 2 hrs, or about 4 hrs. The oxidation process can be followed by the selective removal of second fin regions 120B using a wet etch process to form the structure of FIGS. 12B and 12D. In subsequent processing, cavities 1256 formed as a result of the removal of second fin regions 120B can be filled with one or more layers of gate structures 112 to form a gate-all-around structure around each of the channel regions in second fin regions 122B.

The removal of second fin regions 120B can be followed by the deposition of (i) a layer of dielectric material for gate dielectric layers 112B on the structure of FIG. 12A, (ii) a layer of conductive barrier material for gate barrier layers 128 on the layer of dielectric material, (iii) a layer of work function metal for gate work function layers 130 on the layer of conductive barrier material, and (iv) a layer of conductive material for gate metal fill layers 132 on the layer of work function metal. In some embodiments, as shown in FIG. 1A, the layers of dielectric material, conductive barrier material, and work function metal, can each form conformal layers within cavities 1254 (shown in FIG. 12B) formed as result of the removal of polysilicon structures 112A*-112B*. In some embodiments, as shown in FIG. 1D, the layers of dielectric material, conductive barrier material, and work function metal can each wrap around second fin regions 122B and fill cavities 1256 (shown in FIG. 12B) formed as a result of the removal of second fin regions 120B of semiconductor layers 120.

The layer of dielectric material for gate dielectric layers 112B can include silicon oxide and can be formed by CVD, atomic layer deposition (ALD), physical vapor deposition (PVD), e-beam evaporation, or other suitable processes. In some embodiments, the layer of dielectric material can include (i) a layer of silicon oxide, silicon nitride, and/or silicon oxynitride, (ii) a high-k dielectric material such as, for example, hafnium oxide ($HfO_2$), $TiO_2$, HfZrO, $Ta_2O_3$, $HfSiO_4$, $ZrO_2$, $ZrSiO_2$, (iii) a high-k dielectric material having oxides of Li, Be, Mg, Ca, Sr, Sc, Y, Zr, Al, La, Ce, Pr, Nd, Sm, Eu, Gd, Tb, Dy, Ho, Er, Tm, Yb, or Lu, or (iv) a combination thereof. High-k dielectric layers can be formed by ALD and/or other suitable methods.

The layer of conductive barrier material for gate barrier layers 128 can include Ti, Ta, TiN, TaN, or other suitable diffusion barrier materials and can be formed by ALD, PVD, CVD, or other suitable metal deposition processes. In some embodiments, the layer of conductive barrier material can include substantially fluorine-free metal or metal-containing film and can be formed by ALD or CVD using one or more non-fluorine based precursors. The substantially fluorine-free metal or fluorine-free metal-containing film can include an amount of fluorine contaminants less than 5 atomic percent in the form of ions, atoms, and/or molecules.

The layer of work function metal for work function layers 130 can include Al, Cu, W, Ti, Ta, TiN, TaN, NiSi, CoSi, Ag, TaC, TaSiN, TaCN, TiAl, TiAlN, WN, metal alloys, and/or combinations thereof. In some embodiments, the layer of work function metal can include Al-doped metal, such as Al-doped Ti, Al-doped TiN, Al-doped Ta, or Al-doped TaN. The layer of work function metal can be deposited using a suitable process such as ALD, CVD, PVD, plating, or combinations thereof. The layer of conductive material for gate electrodes 132 can include Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof and can be formed by ALD, PVD, CVD, or other suitable deposition processes. The deposited layers of dielectric material, conductive barrier material, work function metal, and conductive material can be planarized by a CMP process to form the structure of FIG. 1A. The CMP process can substantially coplanarize top surfaces of gate dielectric layers 112B, gate barrier layers 128, gate work function layers 130, gate metal fill layers 132 with top surfaces of ILD layers 118 as shown in FIG. 1A.

The formation of gate structures 112 can be followed by formation of other elements such as S/D contacts, gate contacts, vias, interconnect metal layers, dielectric layers, passivation layers, etc., which are not shown for the sake of clarity.

The present disclosure provides example isolation structures (e.g., isolation structure 104) between FET devices (e.g., finFETs 1-2A-102B) in a semiconductor device and/or in an integrated circuit (IC) and example methods for fabricating the same. The example methods can form isolation structures without substantially degrading (e.g., reducing or relaxing) strain in the channel regions (e.g., second fin regions 122B) of the FET devices, and consequently, without degrading channel mobility performance of the FET devices.

In some embodiments, the isolation structures can include polysilicon gate structures (e.g., polysilicon structure 104A) configured to electrically isolate the FET devices from each other. The polysilicon gate structures can be in a reverse bias configuration to provide electrical isolation between the FET devices. The polysilicon gate structures can be configured to have work function values resulting in higher threshold voltages and smaller reverse-bias leakage currents of the polysilicon gate structures than isolation structures based on non-polysilicon gate (e.g., metal gate) structures. The higher threshold voltages and smaller reverse-bias leakage currents provide more efficient and reliable electrical isolation between the FET devices than that achieved with the non-polysilicon gate structures.

In some embodiments, the threshold voltages of the polysilicon gate structures can be about 0.1 V to about 0.5 V greater (e.g., about 0.2 V, about 0.25 V about 0.3 V, about 0.35 V, about 0.4 V, or about 0.45 V greater) than the threshold voltages of the non-polysilicon gate structures. In some embodiments, the reverse-bias leakage currents of the polysilicon gate structures can be at least about 5 orders of magnitude smaller than the reverse-bias leakage currents of the non-polysilicon gate structures. In some embodiments, the reverse-bias leakage currents of the polysilicon gate structures can be about 5 orders to about 10 orders (e.g., about 6 orders, about 7 orders, about 8 orders, or about 9 orders) of magnitude smaller than the reverse-bias leakage currents of the non-polysilicon gate structures.

Such high threshold voltages and small reverse-bias leakage currents can be achieved in the polysilicon gate structures with high aspect ratios, (e.g., ratios between gate heights and gate lengths equal to or greater than about 9) and small gate lengths (e.g., gate lengths equal to or smaller than about 15 nm) fabricated without the complexities of depositing work function metals in a poly gate replacement process. As such, the polysilicon gate structures can be fabricated with fewer process steps and at lower manufacturing costs than the non-polysilicon gate structures with similar high aspect ratios and small gate lengths. As a result, the example isolation structures disclosed herein can increase the packing density of FET devices in the semiconductor device and/or in the integrated circuit (IC) without a substantial trade-off between manufacturing costs and device performance.

In some embodiments, a method of fabricating a semiconductor device includes forming a fin structure on a substrate, forming polysilicon gate structures with a first threshold voltage on first fin portions of the fin structure, forming doped fin regions with dopants of a first type conductivity on second fin portions of the fin structure, doping at least one of the polysilicon gate structures with dopants of a second type conductivity to adjust the first threshold voltage to a greater second threshold voltage, and replacing at least two of the polysilicon gate structures adjacent to the at least one of the polysilicon gate structures with metal gate structures having a third threshold voltage less than the first and second threshold voltages.

In some embodiments, a method of fabricating a semiconductor device includes forming a fin structure with a stacked fin portion and a fin base portion on a substrate, forming polysilicon gate structures with a first work function value on first fin regions of the stacked fin portion, forming doped fin regions with dopants of a first type conductivity on second fin regions of the stacked fin portion, doping one of the polysilicon gate structures with dopants of a second type conductivity to adjust the first work function value to a second work function value, patterning a photoresist layer on two of the polysilicon gate structures adjacent to the one of the polysilicon gate structures prior to the doping process, and replacing the two of the polysilicon gate structures with non-polysilicon gate structures having a third work function value less than the first and second work function values. The stacked fin portion is epitaxially grown on the fin base portion.

In some embodiments, a semiconductor device includes a first fin field effect transistor (finFET) with a first non-polysilicon gate structure and a doped fin region disposed on a fin structure on a substrate. The doped fin region has dopants of a first type conductivity. The semiconductor device further includes a second finFET with a second non-polysilicon gate structure disposed on the fin structure and an isolation structure disposed on the fin structure. The isolation structure is configured to electrically isolate the first and second finFETs from each other and includes a polysilicon gate structure with dopants of a second type conductivity opposite to the first type conductivity.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a fin structure with a stacked fin portion and a fin base portion on the substrate;
   first and second doped fin regions with dopants of a first type conductivity disposed on a first region of the stacked fin portion;
   a polysilicon gate structure disposed on a second region of the stacked fin portion and between the first and second doped fin regions, wherein the polysilicon gate structure comprises dopants of a second type conductivity that is opposite to the first type conductivity; and
   first and second non-polysilicon gate structures disposed on third regions of the stacked fin portion,
   wherein the first doped fin region is disposed between the first non-polysilicon gate structure and the polysilicon gate structure and the second doped fin region is disposed between the second non-polysilicon gate structure and the polysilicon gate structure.

2. The semiconductor device of claim 1, wherein the polysilicon gate structure is disposed between the first and second non-polysilicon gate structures.

3. The semiconductor device of claim 1, wherein the polysilicon gate structure comprises a gate oxide layer and a polysilicon layer disposed on the gate oxide layer.

4. The semiconductor device of claim 1, wherein the first and second non-polysilicon gate structures comprise gate-all-around (GAA) structures.

5. The semiconductor device of claim 1, wherein the stacked fin portion comprises a stack of channel regions disposed under the first and second non-polysilicon gate structures.

6. The semiconductor device of claim 1, wherein the polysilicon gate structure comprises a first work function value, and wherein the first and second non-polysilicon gate structures comprise a second work function value that is smaller than the first work function value.

7. A semiconductor device, comprising:
a first fin field effect transistor (finFET) with a first non-polysilicon gate structure and a doped epitaxial fin region on a fin structure on a substrate, wherein the doped epitaxial fin region has dopants of a first type conductivity;
a second finFET with a second non-polysilicon gate structure disposed on the fin structure; and
an isolation structure disposed on the fin structure and configured to electrically isolate the first and second finFETs from each other,
wherein the isolation structure comprises a polysilicon gate structure with dopants of a second type conductivity opposite to the first type conductivity.

8. The semiconductor device of claim 7, wherein the polysilicon gate structure is interposed between the first and second non-polysilicon gate structures.

9. The semiconductor device of claim 7, wherein the second finFET comprises a doped epitaxial fin region on the fin structure, and wherein the doped epitaxial fin region has dopants of the first or second type conductivity.

10. The semiconductor device of claim 7, wherein the non-polysilicon gate structures comprise gate all around (GAA) structures.

11. A semiconductor device, comprising:
a substrate;
a fin structure on the substrate;
an epitaxial region with dopants of a first type conductivity surrounding a first portion of the fin structure;
a polysilicon structure with dopants of a second type conductivity surrounding a second portion of the fin structure; and
a gate structure surrounding a third portion of the fin structure, wherein the epitaxial region is disposed between the gate structure and the polysilicon structure.

12. The semiconductor device of claim 11, wherein the polysilicon structure comprises a first work function value and the gate structure comprises a second work function value that is smaller than the first work function value.

13. The semiconductor device of claim 11, further comprising an oxide layer disposed between the polysilicon structure and the second portion of the fin structure.

14. The semiconductor device of claim 11, wherein the epitaxial region is disposed on a stack of semiconductor layers of the fin structure.

15. The semiconductor device of claim 11, wherein the polysilicon structure is disposed on a stack of semiconductor layers of the fin structure, and wherein the stack of semiconductor layers comprises first and second semiconductor layers different from each other.

16. The semiconductor device of claim 11, wherein the polysilicon structure has an aspect ratio equal to or greater than 9.

17. The semiconductor device of claim 11, wherein the polysilicon structure has a dopant concentration of about $3 \times 10^{18}$ atoms/cm$^3$ to about $5 \times 10^{23}$ atoms/cm$^3$.

18. The semiconductor device of claim 11, wherein the gate structure comprises a high-k metal gate structure.

19. The semiconductor device of claim 11, wherein the gate structure comprises a gate all around (GAA) structure.

20. The semiconductor device of claim 11, wherein the gate structure is disposed on a stack of semiconductor layers of the fin structure, and
wherein a gate oxide layer of the gate structure surrounds each of the semiconductor layers.

* * * * *